(12) United States Patent
Miki et al.

(10) Patent No.: US 8,550,645 B2
(45) Date of Patent: Oct. 8, 2013

(54) ILLUMINATION DEVICE FOR DISPLAY DEVICE, AND DISPLAY DEVICE

(75) Inventors: Hisayuki Miki, Chiba (JP); Kousuke Shioi, Ichihara (JP); Naoto Hirosaki, Tsukuba (JP)

(73) Assignees: Showa Denko K.K., Tokyo (JP); National Institute for Materials Science, Ibaraki (JP)

( * ) Notice: Subject to any disclaimer, the term of this patent is extended or adjusted under 35 U.S.C. 154(b) by 194 days.

(21) Appl. No.: 13/131,494

(22) PCT Filed: Nov. 25, 2009

(86) PCT No.: PCT/JP2009/006365
§ 371 (c)(1),
(2), (4) Date: May 26, 2011

(87) PCT Pub. No.: WO2010/061597
PCT Pub. Date: Jun. 3, 2010

(65) Prior Publication Data
US 2011/0235309 A1    Sep. 29, 2011

(30) Foreign Application Priority Data
Nov. 28, 2008    (JP) .................................. 2008-305317

(51) Int. Cl.
*G09F 13/04*    (2006.01)
*G09F 13/08*    (2006.01)
*H01J 1/62*    (2006.01)
*H01J 63/04*    (2006.01)

(52) U.S. Cl.
USPC ............. 362/97.2; 252/301.4 F; 252/301.6 F; 313/483; 313/503; 423/326; 428/404

(58) Field of Classification Search
USPC ................... 252/301.4 F, 301.6 F; 313/483, 313/503; 362/97.2; 423/326; 428/404
See application file for complete search history.

(56) References Cited

U.S. PATENT DOCUMENTS

| | | | |
|---|---|---|---|
| 6,245,259 | B1 | 6/2001 | Hohn et al. |
| 6,577,073 | B2 | 6/2003 | Shimizu et al. |
| 6,657,379 | B2 | 12/2003 | Ellens et al. |
| 6,670,748 | B2 | 12/2003 | Ellens et al. |

(Continued)

FOREIGN PATENT DOCUMENTS

| | | |
|---|---|---|
| CN | 1918262 A | 2/2007 |
| CN | 1934220 A | 3/2007 |

(Continued)

OTHER PUBLICATIONS

Extended European Search Report dated Nov. 16, 2012 issued in corresponding European Patent Application No. 09828847.5.

(Continued)

*Primary Examiner* — Bijan Ahvazi
(74) *Attorney, Agent, or Firm* — Sughrue Mion, PLLC

(57) ABSTRACT

An illumination device for a display device, which is formed from a substrate and a plurality of white light-emitting devices disposed on top of the substrate, and can be used as a backlight for a liquid crystal display panel, wherein the white light-emitting devices have a light source and a phosphor that is excited by the light source and emits light, and a fluorescent material with a composition represented by a general formula: $M(0)_a M(1)_b M(2)_{x-(vm+n)} M(3)_{(vm+n)-y} O_n N_{z-n}$ is used as the phosphor.

19 Claims, 9 Drawing Sheets

(56) References Cited

U.S. PATENT DOCUMENTS

| | | |
|---|---|---|
| 2003/0030368 A1 | 2/2003 | Ellens et al. |
| 2003/0094893 A1 | 5/2003 | Ellens et al. |
| 2005/0012075 A1 | 1/2005 | Sakata et al. |
| 2006/0043337 A1 | 3/2006 | Sakane et al. |
| 2006/0065878 A1 | 3/2006 | Sakane et al. |
| 2006/0186377 A1 | 8/2006 | Takahashi et al. |
| 2006/0197439 A1 | 9/2006 | Sakane et al. |
| 2006/0220047 A1 | 10/2006 | Nagatomi et al. |
| 2007/0007494 A1 | 1/2007 | Hirosaki et al. |
| 2007/0018567 A1 | 1/2007 | Hirosaki |
| 2008/0185602 A1 | 8/2008 | Park et al. |
| 2009/0021141 A1 | 1/2009 | Emoto et al. |
| 2009/0121247 A1 | 5/2009 | Tsukagoshi |

FOREIGN PATENT DOCUMENTS

| | | | |
|---|---|---|---|
| CN | 101128564 A | | 2/2008 |
| CN | 101133137 A | | 2/2008 |
| EP | 1278250 A2 | | 1/2003 |
| EP | 1296376 A2 | | 3/2003 |
| JP | 5-152609 A | | 6/1993 |
| JP | 7-099345 A | | 4/1995 |
| JP | 9-153664 A | | 6/1997 |
| JP | 10-012925 A | | 1/1998 |
| JP | 10-093146 A | | 4/1998 |
| JP | 2900928 B2 | | 6/1999 |
| JP | 2927279 B2 | | 7/1999 |
| JP | 2000-34477 A | | 2/2000 |
| JP | 2002-171000 A | | 6/2002 |
| JP | 2002-363554 A | | 12/2002 |
| JP | 3364229 B2 | | 1/2003 |
| JP | 2004-277663 A | | 10/2004 |
| JP | 2005-008793 A | | 1/2005 |
| JP | 2005-036038 A | | 2/2005 |
| JP | 2005-048105 A | | 2/2005 |
| JP | 2005-255895 A | | 9/2005 |
| JP | 2005-336450 A | | 12/2005 |
| JP | 2006-057018 A | | 3/2006 |
| JP | 2006-063214 | * | 3/2006 |
| JP | 2006-063214 A | | 3/2006 |
| JP | 2006-063225 A | | 3/2006 |
| JP | 2006-232868 A | | 9/2006 |
| JP | 2006-321921 | * | 11/2006 |
| JP | 2006-321921 A | | 11/2006 |
| JP | 2007-002085 A | | 1/2007 |
| JP | 2007-112650 A | | 5/2007 |
| JP | 2007-113019 A | | 5/2007 |
| JP | 2007-169428 A | | 7/2007 |
| JP | 2007-231253 A | | 9/2007 |
| JP | 3139038 U | | 1/2008 |
| JP | 2008-266410 A | | 11/2008 |
| JP | 2010-031201 A | | 2/2010 |
| TW | 200717876 A | | 5/2007 |
| TW | 200801159 A | | 1/2008 |
| TW | 200825155 A | | 6/2008 |
| WO | WO 2005/090517 | * | 9/2005 |
| WO | 2005103199 A1 | | 11/2005 |
| WO | 2006093298 A1 | | 9/2006 |
| WO | WO 2006/093135 | * | 9/2006 |
| WO | 2007/099862 A1 | | 7/2007 |
| WO | 2007/099862 A1 | | 9/2007 |

OTHER PUBLICATIONS

Chinese Office Action dated Sep. 21, 2012 issued in corresponding Chinese Patent Application No. 200980147379.6.
Office Action ("Notice of Reasons for Rejection") with a mailing date of Dec. 18, 2012 for corresponding JP Application No. 2008-305317.
Office Action ("Notification for the Opinion of Examination") with a mailing date of Dec. 24, 2012 for corresponding TW Application No. 098140091.
International Search Report with a mailing date of Dec. 2, 2008 for corresponding International Patent Application No. PCT/JP2008/065668.
European Search Report with a mailing date of Nov. 7, 2011 for corresponding EP 08829849.2.
Non-Final Office Action with a mailing date of Dec. 28, 2011 for corresponding U.S. Appl. No. 12/676,094.
Non-Final Office Action with a mailing date of Apr. 4, 2012 for corresponding U.S. Appl. No. 12/676,094.
Taiwanese Office Action (Notification for the Opinion of Examination) with a mailing date of Apr. 18, 2012 for corresponding Taiwanese Patent Application No. 097133533.
Final Office Action with a mailing date of Aug. 7, 2012 for corresponding U.S. Appl. No. 12/676,094.
Office Action with a mailing date of Apr. 2, 2013 for corresponding Chinese Patent Application No. 200980147379.6.

* cited by examiner

US 8,550,645 B2

ILLUMINATION DEVICE FOR DISPLAY DEVICE, AND DISPLAY DEVICE

CROSS REFERENCE TO RELATED APPLICATIONS

This application is a National Stage of International Application No. PCT/JP2009/006365 filed Nov. 25, 2009, claiming priority based on Japanese Patent Application No. 2008-305317 filed Nov. 28, 2008, the contents of all of which are incorporated herein by reference in their entirety.

TECHNICAL FIELD

The present invention relates to an illumination device for a display device and a display device, and relates particularly to an illumination device for a display device and a display device having high color reproducibility.

Priority is claimed on Japanese Patent Application No. 2008-305317, filed Nov. 28, 2008, the content of which is incorporated herein by reference.

BACKGROUND ART

In recent years, because of ongoing improvements in the performance of liquid crystal display devices, further improvements in the brightness and higher levels of color reproducibility are being demanded for the backlight (the illumination device for the display device) used in transmission-type liquid crystal display panels. As a result, although combinations of fluorescent display tubes and light guide plates have conventionally been the predominant form of backlights, in recent years, backlights that employ LED devices have started to be used. Examples of these backlights that employ LED devices include devices in which a plurality of white LED devices are aligned on a substrate.

Examples of known white LED devices include white light-emitting diode devices composed of a combination of a blue light-emitting diode element (a blue LED chip) and a blue light-absorbing yellow light-emitting phosphor (namely, BY-type white LED devices), and white light-emitting diode devices composed of a combination of a blue LED chip, a blue light-absorbing green light-emitting phosphor, and a blue light-absorbing red light-emitting phosphor (namely, RGB-type white LED devices), and these devices are already in practical use in the backlights mentioned above.

As an example of the BY-type white LED device mentioned above, Patent Document 1 discloses a white light-emitting diode device that employs a combination of a blue light-emitting diode element and a blue light-absorbing yellow light-emitting phosphor. Further, Patent Document 2 discloses a light-emitting diode device of a similar configuration. Moreover, Patent Document 3 discloses a light-emitting diode device of a similar configuration as a light-emitting element that employs a wavelength-converting casting material.

As an example of the RGB-type white LED device mentioned above, Patent Document 4 discloses a phosphor-coated light-emitting diode which contains a semiconductor light-emitting element that emits ultraviolet light or near ultraviolet light, and a phosphor that is deposited on the surface of the element. In this structure, depending on the type of phosphor deposited on the surface of the element, the light emitted from this phosphor-coated light-emitting diode (LED device) may be blue, green or red. Further, Patent Document 5 discloses a dot matrix-type display device which contains a light-emitting layer composed of a group III nitride semiconductor, and three different phosphors, which receive the ultraviolet light having an emission peak wavelength of 380 nm emitted by the light-emitting layer, and emit light of the three primary colors of red, green and blue respectively.

The LED devices disclosed in Patent Documents 1 to 5 can be produced, for example, using conventional methods such as those disclosed in Patent Document 6 and Patent Document 7.

In these light-emitting diodes, one series of phosphors that is often used as a blue light-absorbing yellow light-emitting phosphor is the cerium-activated yttrium-aluminum-garnet (YAG)-based oxide phosphors represented by the general formula: $(Y,Gd)_3(Al,Ga)_5O_{12}:Ce^{3+}$.

The above-mentioned BY-type white LED devices have tended to suffer from a problem wherein the red component is inadequate, leading to a bluish white emission that results in an observed bias in the color rendering properties. Further, as the brightness of the above blue LED chip is increased, the amount of heat generated also increases, and some phosphors have suffered from a problem wherein the heat causes a portion of the phosphor to decompose and stop emitting light, leading to a reduction in the light emission brightness of the LED chip. Moreover, in the case of YAG phosphors and the like, because they suffer from reduced conversion efficiency at high temperature, a problem wherein the light emission intensity decreases rapidly under high-temperature environments has also sometimes occurred.

Besides the yttrium-aluminum-garnet (YAG)-based oxide phosphors mentioned above, other known examples of blue light-absorbing yellow light-emitting phosphors are sulfide-based phosphors. For example, Patent Document 8 discloses a white light-emitting semiconductor light-emitting element which uses a semiconductor light-emitting element that emits light of a wavelength of 390 to 420 nm, and a phosphor that is excited by the light emitted from this semiconductor light-emitting element. All manner of oxide and sulfide phosphors can be used as the phosphor that is excited and emits light upon irradiation with the light of wavelength of 390 to 420 nm. However, in the case of the sulfide-based phosphors, chemical stability has been a problem, and the necessary lifespan required for use as a white light LED device has not always been achievable.

Examples of known blue light-absorbing yellow light-emitting phosphors besides the phosphors mentioned above include silicate phosphors, phosphate phosphors and aluminate phosphors. However, these phosphors also suffer from a decrease in the light emission brightness of the phosphor upon exposure to excitation sources having a high level of energy such as vacuum ultraviolet light, ultraviolet light, electron beams and blue light.

On the other hand, oxynitride phosphors such as sialon phosphors are reported to undergo minimal deterioration in the brightness even when exposed to the above-mentioned excitation sources. For example, Patent Document 9 discloses a sialon phosphor containing Ca. This sialon phosphor is produced by first mixing silicon nitride ($Si_3N_4$), aluminum nitride (AlN), calcium carbonate ($CaCO_3$) and europium oxide ($Eu_2O_3$) in a predetermined molar ratio, and then performing a calcination using a hot press method by holding the mixture for one hour within 1 atmosphere of nitrogen (0.1 MPa) at a temperature of 1,700° C. The α-sialon phosphor containing a solid solution of Eu ions obtained using the above method is a blue light-absorbing yellow light-emitting phosphor that is excited by blue light of 450 to 500 nm and emits yellow light of 550 to 600 nm.

Further, Patent Document 10 relates to a different sialon phosphor, and discloses a β-sialon phosphor having a β-$Si_3N_4$ structure. This β-sialon phosphor is a blue light-absorbing yellow light-emitting phosphor that emits green to orange light of 500 to 600 nm upon excitation with ultraviolet light to blue light.

Patent Document 11 discloses an oxynitride phosphor composed of a JEM phase. This oxynitride phosphor is a blue light-absorbing green light-emitting phosphor that is excited by ultraviolet light to blue light, and emits light having an emission wavelength peak of 460 to 510 nm.

CITATION LIST

Patent Documents

[Patent Document 1] Japanese Patent (Granted) Publication No. 2,900,928
[Patent Document 2] Japanese Patent (Granted) Publication No. 2,927,279
[Patent Document 3] Japanese Patent (Granted) Publication No. 3,364,229
[Patent Document 4] Japanese Unexamined Patent Application, First Publication No. Hei 10-12925
[Patent Document 5] Japanese Unexamined Patent Application, First Publication No. Hei 9-153664
[Patent Document 6] Japanese Unexamined Patent Application, First Publication No. Hei 5-152609
[Patent Document 7] Japanese Unexamined Patent Application, First Publication No. Hei 7-99345
[Patent Document 8] Japanese Unexamined Patent Application, First Publication No. 2002-171000
[Patent Document 9] Japanese Unexamined Patent Application, First Publication No. 2002-363554
[Patent Document 10] Japanese Unexamined Patent Application, First Publication No. 2005-255895
[Patent Document 11] Japanese Unexamined Patent Application, First Publication No. 2006-232868

DISCLOSURE OF INVENTION

Problems To Be Solved By The Invention

The present invention takes the above circumstances into consideration, with an object of providing an illumination device for a display device and a display device that exhibit high brightness, long life, and excellent color reproducibility.

Means To Solve The Problems

As a result of intensive research aimed at achieving the above object, the inventors of the present invention discovered that a phosphor having a fluorescent material with a composition represented by a general formula: $M(0)_a M(1)_b M(2)_{x-(vm+n)} M(3)_{(vm+n)-y} O_n N_{z-n}$, wherein M(0) represents one or more elements selected from the group consisting of Li, Na, Be, Mg, Ca, Sr, Ba, Sc, Y, La, Gd and Lu, M(1) represents one or more activators selected from the group consisting of Mn, Ce, Pr, Nd, Sm, Eu, Tb, Dy, Ho, Er, Tm and Yb, M(2) represents one or more elements selected from the group consisting of Si, Ge, Sn, Ti, Hf and Zr, M(3) represents one or more elements selected from the group consisting of Be, B, Al, Ga, In, Tl and Zn, O represents the element oxygen, N represents the element nitrogen, and the atomic ratio between M(0), M(1), M(2), M(3), O and N is adjusted so that x, y and z satisfy $33 \leq x \leq 51$, $8 \leq y \leq 12$ and $36 \leq z \leq 56$ respectively, a and b satisfy $3 \leq a+b \leq 7$ and $0.001 \leq b \leq 1.2$, m and n satisfy $0.8 \cdot me \leq m \leq 1.2 \cdot me$ (wherein $me=a+b$) and $0 \leq n \leq 7$, and v satisfies $v=\{a \cdot v(0)+b \cdot v(1)\}/(a+b)$ (wherein v(0) represents the valency of an M(0) ion and v(1) represents the valency of an M(1) ion), displays a green light emission with an emission peak wavelength near 520 nm and an emission spectrum having a narrow full width at half maximum, and is ideal as a blue light-absorbing green light-emitting phosphor for an above-mentioned RGB-type white LED device.

As a result of performing further research based on this finding, the inventors were able to complete the present invention, which includes the aspects described below.

(1) An illumination device for a display device, which is formed from a substrate and a plurality of white light-emitting devices disposed on top of the substrate, and can be used as a backlight for a liquid crystal display panel, wherein the white light-emitting devices have a light source and a phosphor that is excited by the light source and emits light, and a fluorescent material with a composition represented by a general formula: $M(0)_a M(1)_b M(2)_{x-(vm+n)} M(3)_{(vm+n)-y} O_n N_{z-n}$ is used as the phosphor (wherein M(0) represents one or more elements selected from the group consisting of Li, Na, Be, Mg, Ca, Sr, Ba, Sc, Y, La, Gd and Lu, M(1) represents one or more activators selected from the group consisting of Mn, Ce, Pr, Nd, Sm, Eu, Tb, Dy, Ho, Er, Tm and Yb, M(2) represents one or more elements selected from the group consisting of Si, Ge, Sn, Ti, Hf and Zr, M(3) represents one or more elements selected from the group consisting of Be, B, Al, Ga, In, Tl and Zn, O represents the element oxygen, N represents the element nitrogen, x, y and z are numbers that satisfy $33 \leq x \leq 51$, $8 \leq y \leq 12$ and $36 \leq z \leq 56$ respectively, a and b are numbers that satisfy $3 \leq a+b \leq 7$ and $0.001 \leq b \leq 1.2$, m and n are numbers which, when $me=a+b$, satisfy $0.8 \cdot me \leq m \leq 1.2 \cdot me$ and $0 \leq n \leq 7$, and v is a number which, when v(0) represents the valency of an M(0) ion and v(1) represents the valency of an M(1) ion, satisfies $v=\{a \cdot v(0)+b \cdot v(1)\}/(a+b)$).

(2) The illumination device for a display device according to (1), wherein M(1) in the fluorescent material is Eu, and b is a number that satisfies $0.005 \leq b \leq 0.3$.

(3) The illumination device for a display device according to (1) or (2), wherein M(1) in the fluorescent material is Eu, and b is a number that satisfies $0.01 \leq b \leq 0.2$.

(4) The illumination device for a display device according to any one of (1) to (3), wherein x, y and z in the fluorescent material are $x=42$, $y=10$ and $z=46$ respectively.

(5) The illumination device for a display device according to any one of (1) to (4), wherein M(0) in the fluorescent material is one or more elements selected from the group consisting of Ca, Sr and Ba.

(6) The illumination device for a display device according to any one of (1) to (5), wherein M(2) in the fluorescent material is Si, and M(3) is Al.

(7) The illumination device for a display device according to any one of (1) to (6), wherein n in the fluorescent material is a number that satisfies $n \leq me$.

(8) The illumination device for a display device according to any one of (1) to (7), wherein as the above-mentioned phosphor, a phosphor is used in which the amount of the above fluorescent material is not less than 80% by volume, and the remainder is composed of one or more substances selected from the group consisting of β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1) and $SrSi_6N_8$.

(9) The illumination device for a display device according to any one of (1) to (8), wherein the phosphor is a powder with an average particle size of not less than 0.1 μm and not more than 50 μm.

(10) The illumination device for a display device according to (9), wherein the average aspect ratio of the phosphor is not more than 20.

(11) The illumination device for a display device according to any one of (1) to (10), wherein the phosphor also contains 5 to 300 ppm of fluorine.

(12) The illumination device for a display device according to any one of (1) to (11), wherein the phosphor also contains 10 to 3,000 ppm of boron.

(13) The illumination device for a display device according to any one of (1) to (12), wherein a transparent film is formed at least partially on a surface of the phosphor, and if the refractive index of the transparent film is termed $n_k$, then the thickness of the transparent film is within a range from (10 to 180)/$n_k$ (units: nanometers).

(14) The illumination device for a display device according to (13), wherein the refractive index $n_k$ of the transparent film is not less than 1.2 and not more than 2.5.

(15) The illumination device for a display device according to (14), wherein the refractive index $n_k$ of the transparent film is not less than 1.5 and not more than 2.0.

(16) The illumination device for a display device according to any one of (1) to (15), wherein as the above-mentioned phosphor, a red light-emitting fluorescent material is used in addition to the above fluorescent material.

(17) The illumination device for a display device according to (16), wherein the red light-emitting fluorescent material is $CaAlSiN_3$:Eu.

(18) The illumination device for a display device according to any one of (1) to (17), wherein the light source is a blue light-emitting LED chip having an emission peak wavelength within a range from 330 to 500 nm.

(19) The illumination device for a display device according to (18), wherein the emission peak wavelength of the LED chip is within a range from 420 to 470 nm.

(20) The illumination device for a display device according to any one of (1) to (19), wherein a white light emission is obtained from each of the white light-emitting devices by mixing a blue light emission from the LED chip, a green light emission from the fluorescent material that has been excited by the blue light emission, and a red light emission from the red light-emitting fluorescent material that has been excited by the blue light emission.

(21) The illumination device for a display device according to any one of (1) to (20), wherein each of the white light-emitting devices is a bullet white LED device or a surface-mounted white LED device.

(22) The illumination device for a display device according to (21), wherein the bullet white LED device or surface-mounted white LED device has a reflector surface that reflects the light emitted from the LED chip in a frontal direction.

(23) The illumination device for a display device according to (21) or (22), wherein the surface-mounted white LED device has a wall member positioned so as to surround the LED chip, and a reflector surface is formed on the wall member.

(24) The illumination device for a display device according to any one of (21) to (23), wherein the surface-mounted white LED device is a chip-on-board device in which the LED chip is mounted directly on a wiring board.

(25) The illumination device for a display device according to any one of (21) to (24), wherein the wiring board and/or the wall member contain a resin member and/or a ceramic member.

(26) The illumination device for a display device according to (25), wherein the resin member is formed from a thermo-setting resin material.

(27) The illumination device for a display device according to any one of (1) to (26), wherein each of the white light-emitting devices has an LED chip and a resin formed surrounding the LED chip, and the phosphor is dispersed within the resin.

(28) The illumination device for a display device according to (27), wherein the phosphor is dispersed within the resin so as to exist in a high density near the LED chip.

In this description, "near" the LED chip typically refers to a region within a distance of 0 to 1,000 μm, and preferably 0 to 500 μm, from the surface of the LED chip. The expression "high density" means a density that is high in relative terms, and in this description, the density of the phosphor that exists near the LED chip need simply be greater than the density of the phosphor that exists in other regions, although the case where the density near the LED chip is 100% is also permitted.

(29) The illumination device for a display device according to (27) or (28), wherein the resin is composed of a first resin that is formed so as to cover the LED chip and a second resin that is formed so as to cover the first resin, and the phosphor is dispersed within the first resin.

(30) The illumination device for a display device according to any one of (1) to (26), wherein the phosphor is adhered directly to the LED chip so as to cover at least one surface of the LED chip.

(31) The illumination device for a display device according to (30), wherein the phosphor is formed as a layer.

(32) The illumination device for a display device according to (30) or (31), wherein the thickness of the phosphor is within a range from 1 μm to 100 μm.

(33) The illumination device for a display device according to any one of (27) to (32), wherein the resin contains a silicone resin within at least some regions.

(34) The illumination device for a display device according to (33), wherein the resin contains a methyl silicone resin within at least some regions.

(35) The illumination device for a display device according to (33) or (34), wherein the resin contains a phenyl silicone resin within at least some regions.

(36) The illumination device for a display device according to any one of (1) to (35), wherein one side of the LED chip is larger than 350 μm. Here, although there are no particular limitations on the length of one side of the LED chip, provided the length exceeds 350 μm and the effects of the present invention can be realized, usually, the length of one side is preferably less than 5 mm.

(37) The illumination device for a display device according to any one of (1) to (36), wherein a plurality of the LED chips are provided.

(38) The illumination device for a display device according to any one of (1) to (37), wherein the illumination device is used with a supplied electric power of not less than 0.2 W for each white light-emitting device package. Here, although there are no particular limitations on the supplied electric power for each white light-emitting device package, provided the electric power is not less than 0.2 W and the effects of the present invention can be realized, usually, the electric power is preferably not more than 5 W.

(39) The illumination device for a display device according to any one of (1) to (38), wherein the illumination device is used with a supplied electric power for each white light-emitting device package that is equivalent to a surface area density of not less than $1.5 \times 10^4$ W/m² for each LED chip. Here, although there are no particular limitations on the supplied electric power for each white light-emitting device package, provided the surface area density for each LED chip is not less than $1.5\times10^4$ W/m² and the effects of the present invention can be realized, usually, the surface area density for each LED chip is not more than $1\times10^6$ W/m², and preferably not more than $2\times10^5$ W/m².

(40) The illumination device for a display device according to (39), wherein the illumination device is used with a supplied electric power for each white light-emitting device package that is equivalent to a surface area density of not less than $5\times10^4$ W/m² for each LED chip. Here, although there are no particular limitations on the supplied electric power for each white light-emitting device package, provided the surface area density for each LED chip is not less than $5\times10^4$ W/m² and the effects of the present invention can be realized, usually, the surface area density for each LED chip is preferably not more than $2\times10^5$ W/m².

(41) A display device, including the illumination device for a display device according to any one of (1) to (40), and a transmission-type liquid crystal display panel.

Effect of the Invention

According to the aspects described above, an illumination device for a display device and a display device that exhibit high brightness, long life, and excellent color reproducibility can be provided.

The illumination device for a display device according to the present invention is an illumination device for a display device that can be used as the backlight for a transmission-type liquid crystal display panel, wherein the illumination device for a display device contains a rectangular-shaped substrate and a plurality of light-emitting devices disposed on top of the substrate, the light-emitting devices include a light source and a phosphor that is excited by the light source and emits light, and a fluorescent material with a composition represented by a general formula: $M(0)_a M(1)_b M(2)_{x-(vm+n)} M(3)_{(vm+n)-y} O_n N_{z-n}$ is used as the phosphor, wherein $M(0)$ represents one or more elements selected from the group consisting of Li, Na, Be, Mg, Ca, Sr, Ba, Sc, Y, La, Gd and Lu, $M(1)$ represents one or more activators selected from the group consisting of Mn, Ce, Pr, Nd, Sm, Eu, Tb, Dy, Ho, Er, Tm and Yb, $M(2)$ represents one or more elements selected from the group consisting of Si, Ge, Sn, Ti, Hf and Zr, $M(3)$ represents one or more elements selected from the group consisting of Be, B, Al, Ga, In, Tl and Zn, O represents the element oxygen, N represents the element nitrogen, x, y and z satisfy $33 \le x \le 51$, $8 \le y \le 12$ and $36 \le z \le 56$ respectively, a and b satisfy $3 \le a+b \le 7$ and $0.001 \le b \le 1.2$, m and n satisfy $0.8 \cdot me \le m \le 1.2 \cdot me$ (wherein $me=a+b$) and $0 \le n \le 7$, and v satisfies $v=\{a \cdot v(0)+b \cdot v(1)\}/(a+b)$ (wherein $v(0)$ represents the valency of an $M(0)$ ion and $v(1)$ represents the valency of an $M(1)$ ion), and therefore the phosphor can be used as a blue light-absorbing green light-emitting phosphor with an emission peak wavelength near 520 nm, which yields chromaticity coordinates for green light emission that are optimal coordinates for a display, and enables an illumination device for a display device and a display device that exhibit high brightness, long life, and excellent color reproducibility to be obtained.

EMBODIMENTS FOR CARRYING OUT THE INVENTION

Embodiments for implementing the present invention are described below.

(First Embodiment)

Figure 1:
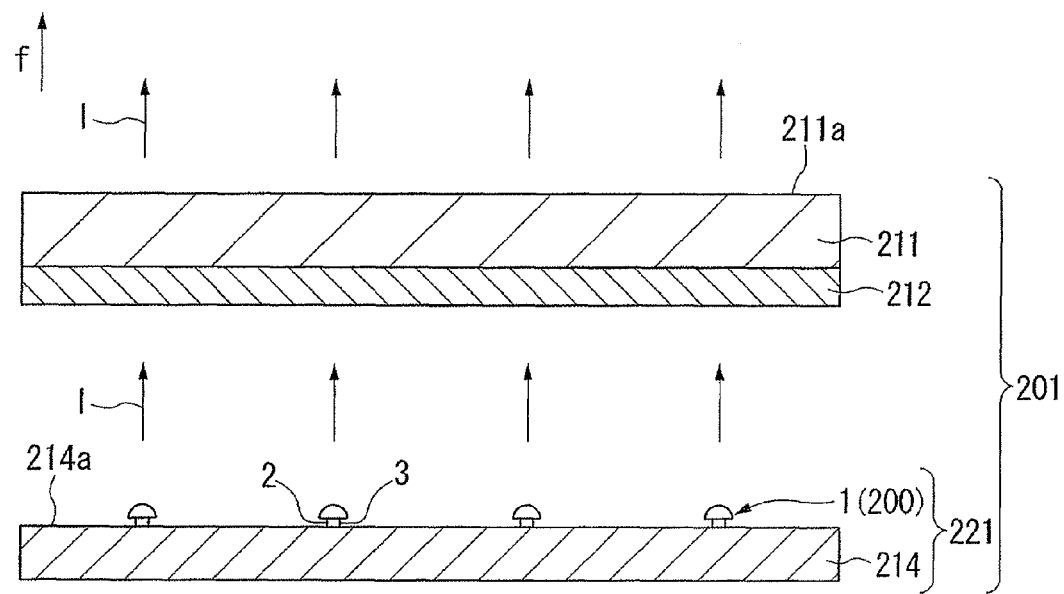
FIG. 1 is a cross-sectional view of an illumination device for a display device and a display device that represent a first embodiment of the present invention.

FIG. 1 is a cross-sectional view describing one example of a display device according to an embodiment of the present invention.

As illustrated in FIG. 1, a display device 201 of this embodiment of the present invention is composed basically of a transmission-type liquid crystal display panel 211, a color filter 212, and an display device illumination device 221 of this embodiment of the present invention.

<Transmission-Type Liquid Crystal Display Panel 211>

The transmission-type liquid crystal display panel 211 is produced by stacking a liquid crystal layer, a transparent electrode layer and an orientation film and the like, and when viewed in plan view, contains a plurality of pixel portions arrayed in a grid, wherein each of the pixel portions can be controlled independently to control the orientation of the liquid crystal of the liquid crystal layer (not shown in the figure). Conventional panels may be used as the transmission-type liquid crystal display panel 211. A detailed description of the panel is omitted here.

<Color Filter 212>

The color filter 212 is a light-transmissive film composed of a plurality of color filter portions of the three primary colors red, green and blue (RGB) arrayed in a grid, wherein each color filter portion is formed so as to coincide with a pixel portion of the transmission-type liquid crystal display panel 211 (not shown in the figure). Conventional filters may be used as the color filter 212. A detailed description of the color filter is omitted here.

Further, in FIG. 1 the color filter 212 is positioned between the transmission-type liquid crystal display panel 211 and the display device illumination device 221, but the present invention is not limited to such configurations, and for example, the color filter 212 may also be positioned on the front-side surface f of the transmission-type liquid crystal display panel 211.

<Display Device Illumination Device 221>

As illustrated in FIG. 1, the display device illumination device 221 according to this embodiment of the present invention includes a plurality of white light-emitting devices 200 positioned on a surface 214a on the front side f of a substrate 214.

Bullet white light LED devices (bullet white light-emitting diode lamps) 1 are used as the white light-emitting devices 200. Each bullet white LED device 1 is connected to the substrate 214 via lead wires 2 and 3.

Although omitted from FIG. 1, wiring is formed on the front-side surface 214a and/or within the interior of the substrate 214, and this wiring is connected to the lead wires 2 and 3, and is also connected to an electrical signal control unit attached to the substrate 214. As a result, on-off switching of the light emission from the bullet white LED devices 1 and control of the emission brightness can be achieved by appropriate operation of the electrical signal control unit.

As indicated by the arrows in FIG. 1, the light emitted in the frontal direction f from the bullet white LED devices 1 passes through the color filter 212 and the transmission-type liquid crystal display panel 211 and is irradiated out in the frontal direction f.

Figure 2:
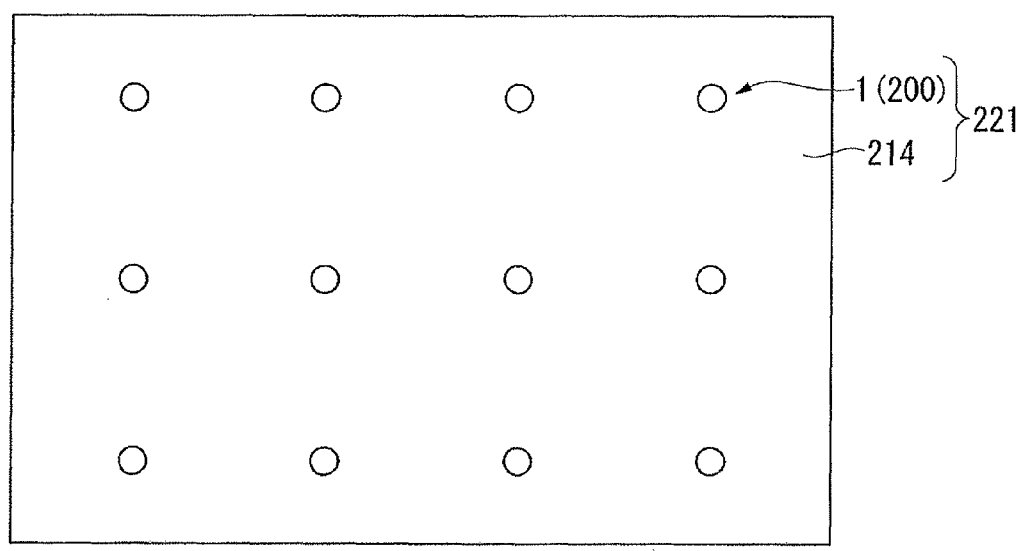
FIG. 2 is a plan view of the illumination device for a display device according to the first embodiment of the present invention.

FIG. 2 is a schematic plan view illustrating one example of the illumination device for the display device.

As illustrated in FIG. 2, when viewed in plan view, the display device illumination device 221 of this embodiment of the present invention appears as a substantially rectangular-shaped substrate 214, with a plurality of white light-emitting devices 200 positioned in a grid on top of the substrate.

The number and positioning of the white light-emitting devices 200 should be determined so that when the light from the display device illumination device 221 passes through the color filter 212 and the transmission-type liquid crystal display panel 211 and is emitted in the frontal direction f, light of uniform intensity is achieved across the display surface 211a of the transmission-type liquid crystal display panel 211. The number and positioning of the white light-emitting devices 200 is not limited to the configuration illustrated in FIG. 2.

Figure 3:
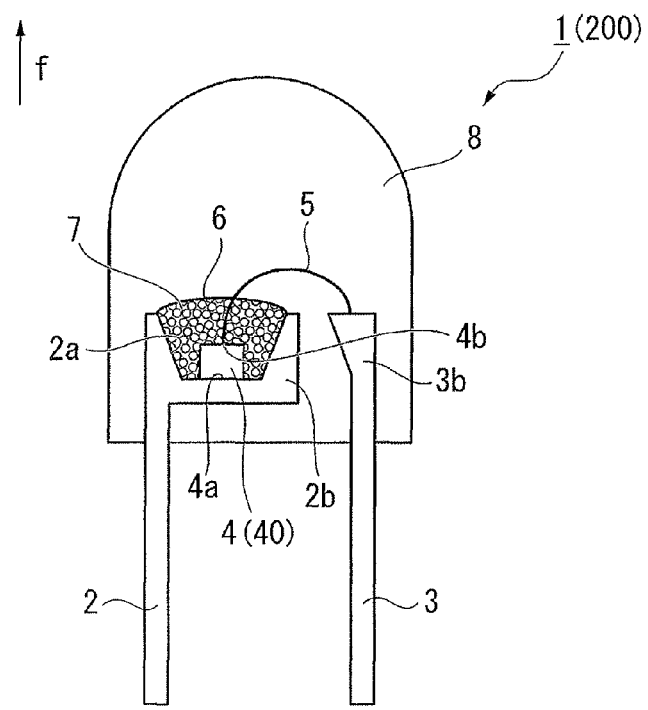
FIG. 3 is a cross-sectional view of a white light-emitting device used within the illumination device for a display device according to the first embodiment of the present invention.

FIG. 3 is an expanded cross-sectional view of a white light-emitting device 200 (bullet white LED device 1) illustrated in FIG. 1.

As illustrated in FIG. 3, the bullet white LED device 1 is provided with a first lead wire 2 and a second lead wire 3, wherein a tip portion 2b of the first lead wire 2 has a recessed section 2a, and a light-emitting diode element (LED chip) 4 that functions as a light source 40 is disposed inside this recessed section 2a.

The LED chip 4 has a top-bottom electrode structure, wherein a bottom electrode 4a is electrically connected to the surface within the bottom of the recessed section 2a via a conductive paste, and a top electrode 4b is electrically connected to the second lead wire 3 via a bonding wire (a fine gold wire) 5.

The recessed section 2a of the first lead wire 2 has an inverted trapezoidal shape when viewed in cross-section, with a bottom surface and side wall surfaces facing the frontal direction f. This bottom surface and these side wall surfaces of the recessed section 2a act as reflector surfaces that reflect the light from the LED chip 4, ensuring that the light is emitted in the frontal direction f.

<Light Source>

The light-emitting diode element (LED chip) 4 is used as the light source 40. By using the LED chip 4 as the light source 40, the device size can be reduced, and the electric power consumption can be suppressed. Further, LED chips 4 can be mass produced cheaply, meaning the production costs for the display device illumination device 221 and the display device 201 can be kept to a minimum.

As the LED chip 4, a blue light-emitting chip having an emission peak wavelength of 330 to 500 nm is preferred, and the emission peak wavelength is more preferably within a range from 420 to 470 nm. This enables the phosphor to be excited efficiently, and also yields a blue light emission that is ideal for the white light-emitting device 200.

From the viewpoint of emission efficiency, the LED chip 4 preferably employs a gallium nitride-based compound semiconductor, which can be formed, for example, using a MOCVD method or HVPE method or the like. Examples of the structure of the gallium nitride-based compound semiconductor include homostructures, heterostructures and double heterostructures having an MIS junction, PIN junction or pn junction or the like. The light-emitting layer of the LED chip 4 preferably employs a gallium nitride-based compound semiconductor represented by the formula: $In_\alpha Al_\beta Ga_{1-\alpha-\beta}N$ (wherein $0 \le \alpha$, $0 \le \beta$, and $\alpha + \beta \le 1$, and is preferably formed as a single quantum well structure or multiple quantum well structure having a quantum effect. The emission peak wavelength from the light-emitting layer can be controlled by controlling the material composition or mixed crystallinity of the gallium nitride-based compound semiconductor.

<Resin>

A transparent first resin 6 is used to fill the recessed section 2a so as to encapsulate the LED chip 4 positioned inside the recessed section 2a. A phosphor 7 is dispersed within the first resin 6.

A transparent second resin 8 is then formed so as to encapsulate the first resin 6 within the recessed section 2a, and also surround the tip portion 2b of the first lead wire 2 and the tip portion 3b of the second lead wire 3. The overall shape of the second resin 8 is a substantially circular cylindrical shape in which the top end has been formed as a lens-shaped curved surface to form a bullet shape. The LED chip 4 is completely encapsulated by the first resin 6 and the second resin 8.

The materials for the first resin 6 and the second resin 8 are preferably selected to minimize deterioration caused by ultraviolet light. The materials preferably contain a silicone resin, and more preferably contain a methyl silicone resin or a phenyl silicone resin. Silicone resins exhibit good resistance to light of short wavelengths, and are therefore ideal for encapsulating an LED chip 4 that emits short-wavelength light. Moreover, by using a methyl silicone resin that also exhibits good flexibility, breakage of the bonding wire can be avoided. On the other hand, the use of a rigid phenyl silicone resin is also preferred. In this case, penetration of moisture or the like into the LED chip 4 is prevented, which is ideal when the device is to be used in a severe environment having high humidity or the like. Further, the resin materials may also include other resins such as polycarbonate resins or epoxy resins, or other transparent materials such as glass.

The first resin 6 and the second resin 8 may employ the same resin or different resins, although from the viewpoints of ease of production and achieving good adhesion, using the same resin is preferable.

Further, because the phosphor 7 undergoes less temperature-induced variation in characteristics than other phosphors, even when the phosphor 7 is positioned near the LED chip 4 and the temperature of the phosphor 7 increases due to the heat generated by the LED chip 4, any variations in the light emission characteristics can be kept to a minimum.

<Refractive Index of the Resins>

In those cases where a gallium nitride-based compound semiconductor is used as the light-emitting material of the LED chip 4 that functions as the light source 40, because the gallium nitride-based compound semiconductor has an extremely high refractive index of approximately 2.4 to 2.5, the first resin 6 that covers the LED chip 4 preferably has a refractive index that is higher than 1.2. On the other hand, the second resin 8 that covers the first resin 6 preferably has a lower refractive index than that of the first resin 6. This enables the light extraction efficiency from the LED chip 4 to be improved.

<Phosphor>

The phosphor 7 includes a fluorescent material with a composition represented by the general formula: $M(0)_a M(1)_b M(2)_{x-(vm+n)} M(3)_{(vm+n)-y} O_n N_{z-n}$. In this formula, O represents the element oxygen, and N represents the element nitrogen. By including the above fluorescent material within the phosphor 7, the light emission intensity can be increased. A detailed description of each of the components of the above general formula is presented below.

<M(0) Element>

The M(0) element preferably employs one or more elements selected from among Li, Na, Be, Mg, Ca, Sr, Ba, Sc, Y, La, Gd and Lu, more preferably employs one or more elements selected from among Ca, Sr and Ba, and most preferably uses Sr.

By employing one or more elements selected from among Ca, Sr and Ba as the M(0) element, a satisfactorily high light emission intensity can be obtained. Further, by using Sr as the M(0) element, an even higher light emission intensity can be obtained.

Moreover, by substituting a portion of the Sr with Ca, the wavelength of the emitted light color can be shifted to a longer wavelength, whereas by substituting a portion of the Sr with Ba, the wavelength can be shifted to a shorter wavelength.

<M(1) Element>

The M(1) element preferably employs one or more elements selected from among the activators Mn, Ce, Pr, Nd, Sm, Eu, Tb, Dy, Ho, Er, Tm and Yb, more preferably employs one or more elements selected from among Ce, Eu and Yb, and most preferably uses Eu.

By employing one or more elements selected from among the activators Mn, Ce, Pr, Nd, Sm, Eu, Tb, Dy, Ho, Er, Tm and Yb as the M(1) element, the emission peak wavelength of the fluorescent material can be set within a range from 480 to 540 nm, enabling the light emission color to be within a range from blue-green to green. As a result, the light emission moves closer to the ideal chromaticity coordinates for the green light used for generating the white light emission used by the display device illumination device (the backlight).

By using Eu as the M(1) element, the emission peak wavelength of the fluorescent material can be set within a range from 495 to 525 nm, yielding a light emission color within a range from blue-green to green. As a result, the position of the chromaticity coordinates for the green light emission from the phosphor 7 can be moved closer to the ideal chromaticity coordinates for a green light emission.

The range for the value of the component ratio b for the M(1) element in general formula (1) preferably satisfies $0.001 \leq b \leq 1.2$. If the value of b is less than 0.001, then the number of atoms that emit light is too small, meaning a satisfactory light emission intensity cannot be obtained, whereas if the value of b exceeds 1.2, then the light emission intensity decreases due to concentration quenching, and neither of these cases is desirable.

The value of b more preferably satisfies $0.005 \leq b \leq 0.3$, and still more preferably satisfies $0.01 \leq b \leq 0.2$. Provided the value of b satisfies this range, a satisfactorily high light emission intensity can be achieved. Further, this limits the emission peak wavelength of the phosphor 7 to a value near 520 nm, meaning the position of the chromaticity coordinates for the green light emission from the phosphor 7 can be moved even closer to the ideal chromaticity coordinates for a green light emission.

By narrowing the full width at half maximum of the light emission spectrum for the phosphor 7, the position of the chromaticity coordinates for the green light emission from the phosphor 7 can be shifted further to the outside of the chromaticity diagram. By positioning the chromaticity coordinates for the light emissions of the RGB three primary colors that constitute the white light emission closer to the respective outside edges of the chromaticity diagram, the surface area of the triangular color reproducibility range formed by the chromaticity coordinates of the three primary colors can be increased. By using a display device illumination device 221 containing white light-emitting devices 200 having these types of light emission characteristics, the color reproducibility of the display device 201 can be enhanced.

Eu (europium) exhibits favorable light emission when in a plus two valency. Accordingly, in terms of the ratio between divalent and trivalent europium within the total amount of europium contained within the phosphor 7, the proportion of divalent europium is preferably as high as possible, and this proportion of divalent europium preferably represents not less than 50% of all the europium. This proportion is more preferably 80% or greater. Residual trivalent europium causes emission at a different wavelength from that of divalent europium, which causes an undesirable change in the emission color. Accordingly, in those cases where a compound containing trivalent Eu is used as a raw material, this trivalent europium must be reduced in a calcination process. The ratio between divalent and trivalent europium can be analyzed by X-ray absorption fine structure (XAFS) analysis.

Further, when the M(1) element is Yb, a green light emission is produced.

<M(2) Element, M(3) Element>

The M(2) element is preferably one or more elements selected from among Si, Ge, Sn, Ti, Hf and Zr, and is most preferably Si. This ensures that a satisfactorily high light emission intensity can be obtained from the phosphor 7.

The M(3) element is preferably one or more elements selected from among Be, B, Al, Ga, In, Tl and Zn, and is most preferably Al. This ensures that a satisfactorily high light emission intensity can be obtained from the phosphor 7.
<x, y, z>

The values of x, y and z preferably satisfy $33 \leq x \leq 51$, $8 \leq y \leq 12$ and $36 \leq z \leq 56$ respectively, and are most preferably x=42, y=10 and z=46. This ensures that a satisfactorily high light emission intensity can be obtained from the phosphor 7.
<a, b>

The preferred range for the value of a+b is $3 \leq a+b \leq 7$.

If the value of a+b is less than 3, then the amount of other crystal phases or amorphous phases increases, such as one or more materials selected from among β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1) and $SrSi_6N_8$, and therefore the light emission intensity decreases, which is not desirable.

Further, if the value of a+b is greater than 7, then the amount of other crystal phases or amorphous phases increases, such as one or more materials selected from among β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1) and $SrSi_6N_8$, and therefore the light emission intensity decreases and the temperature characteristics also tend to deteriorate.
<m, n>

The value of m preferably satisfies $0.8 \cdot me \leq m \leq 1.2 \cdot me$, wherein me=a+b. This ensures that a satisfactorily high light emission intensity can be obtained from the phosphor 7.

The value of n satisfies $0 \leq n \leq 7$, and preferably satisfies $0 \leq n \leq \{a \cdot v(0) + b \cdot v(1)\}/(a+b)$, wherein v(0) represents the valency of an M(0) ion and v(1) represents the valency of an M(1) ion.

If the value of n is less than $\{a \cdot v(0) + b \cdot v(1)\}/(a+b)$, then the temperature characteristics are improved and the aspect ratio decreases, which increases the dispersibility within the resin. Further, if the value of n is less than $\{a \cdot v(0) + b \cdot v(1)\}/(a+b)$, then the light emission wavelength can be shifted to a longer wavelength.

In contrast, if the value of n is greater than $\{a \cdot v(0) + b \cdot v(1)\}/(a+b)$, then the amount of other crystal phases or amorphous phases increases, such as one or more materials selected from among β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1) and $SrSi_6N_8$, and therefore the light emission intensity tends to decrease.

Furthermore, n preferably satisfies $n \leq me$. This ensures that a satisfactorily high light emission intensity can be obtained from the phosphor 7.

If the values of a, b, x, y, z, m and n for the fluorescent material of the phosphor 7 fall outside the respective ranges described above, then the light emission intensity tends to decrease, which is undesirable.

The phosphor 7 may be a phosphor in which the amount of the above-mentioned fluorescent material represents not less than 80% by volume of the entire phosphor, and the remainder is one or more materials selected from among β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1) and $SrSi_6N_8$. The material of this reminder may be either a crystalline phase or an amorphous phase. This ensures that a satisfactorily high light emission intensity can be obtained from the phosphor 7. In those cases where the amount of the above-mentioned fluorescent material is less than 80% by volume, a satisfactorily high light emission intensity may not be obtainable from the phosphor 7.

<Average Particle Size>

The phosphor 7 preferably has an average particle size of not less than 0.1 μm and not more than 50 μm.

If the average particle size is less than 0.1 μm, then the effect of surface defects on the phosphor becomes significant, and the light emission intensity tends to deteriorate. In contrast, if the average particle size is greater than 50 μm, then absorption of the excitation light tends to become insufficient, causing a decrease in the light emission intensity. The particle size of the phosphor 7 can be measured using a laser diffraction and scattering method.

<Average Aspect Ratio>

The average aspect ratio of the primary particles that constitute the powder of the phosphor 7 is preferably not more than 20. This not only improves the dispersibility of the phosphor 7 within resins, but also ensures that the excitation light is absorbed efficiently by the phosphor 7, enabling a satisfactorily high light emission intensity to be obtained from the phosphor 7.

If the above-mentioned average aspect ratio is greater than 20, then mixing the phosphor 7 into a resin is difficult, and voids tend to be generated between the resin and the phosphor 7. These voids scatter light and cause a deterioration in the light emission characteristics of the white light-emitting devices 200. Further, the primary particles may also become confounded, or become aligned in parallel with the excitation light, leading to unsatisfactory absorption of the excitation light by the primary particles, and as a result, a satisfactorily high light emission intensity cannot be obtained. In those cases where the primary particles are plate-like in shape, the aspect ratio is determined from the cross-sectional shape.

<Added Trace Elements>

The phosphor 7 preferably includes 5 to 300 ppm of fluorine and/or 10 to 3,000 ppm of boron as added trace elements.

When 5 to 300 ppm of fluorine or 10 to 3,000 ppm of boron is added, even better light emission characteristics can be obtained from the phosphor 7. This phenomenon is most marked when the amount of fluorine is at least 5 ppm and/or the amount of boron is at least 10 ppm, but if the former exceeds 300 ppm or the latter exceeds 3,000 ppm, then no additional effect is obtained.

<Transparent Film>

A transparent film is preferably formed at least partially on a surface of the phosphor 7. By forming this transparent film, light loss at the interface between the phosphor 7 and the first resin 6 can be reduced.

Examples of preferred materials for this transparent film include inorganic materials such as silica, alumina, titania, magnesia or magnesium fluoride, and resins such as polystyrene, polycarbonate and polymethylstyrene.

If the refractive index of the transparent film is termed $n_k$, then the thickness of the transparent film is preferably within a range from $(10 \text{ to } 180)/n_k$ (units: nanometers). In other words, the appropriate thickness for the transparent film is determined by the refractive index $n_k$ of the transparent film.

If the thickness of the transparent film exceeds the above-mentioned range, then the transparent film itself may absorb light, causing a reduction in the light emission intensity of the white light-emitting device 200. On the other hand, if the thickness of the transparent film is thinner than the above range, then forming a uniform transparent film becomes difficult, and the effect of the transparent film in reducing light loss at the interface between the phosphor 7 and the first resin 6 may be inadequate.

If the refractive index $n_k$ of the transparent film is high, then light loss can be reduced even when the transparent film is thin. For example, when the refractive index $n_k$ of the transparent film is 2.0, the ideal thickness for the transparent film is within a range from 5 to 90 nm.

In contrast, if the refractive index $n_k$ of the transparent film is low, then the transparent film must be made thicker to ensure a satisfactory reduction in the light loss. For example, when the refractive index $n_k$ of the transparent film is 1.5, the ideal thickness for the transparent film is within a range from 6.6 to 120 nm.

In those cases where a phosphor having a transparent film formed on a portion of the surface is used as the phosphor 7, the refractive index of the first resin 6 in which the phosphor 7 is dispersed is preferably similar to the refractive index of the transparent film. This enables better suppression of reflection at the interface between the transparent film and the first resin 6.

In such cases, if a second resin 8 having a lower refractive index than the first resin 6 is provided on the outside of the first resin 6 in which the phosphor 7 is dispersed, then the light emission intensity of the white light-emitting device 200 can be further improved.

<Oxygen Content>

In those cases where the oxygen content of the phosphor 7 is larger than the value calculated on the basis of the above-mentioned general formula by an amount not exceeding 0.4% by mass, the light emission characteristics of the phosphor 7 can be further improved.

This oxygen content that is larger than the calculated value by an amount not exceeding 0.4% by mass constitutes a transparent film formed at least partially on a surface of the powdered particles of the phosphor 7. The presence of this transparent film improves the oxidation resistance of the phosphor 7, and reduces the difference between the refractive index of the phosphor particles and the refractive index of the first resin 6. As a result, light loss at the interface between the phosphor 7 and the first resin 6 is reduced. Moreover, the number of unpaired electrons and defects on the particle surface of the fluorescent material contained within the phosphor 7 are reduced, thereby increasing the light emission intensity from the phosphor 7.

<Dispersibility>

The surface of the powdered particles of the phosphor 7 may by subjected to a coupling treatment. This coupling treatment not enables the dispersibility to be improved when the phosphor 7 is dispersed within the first resin 6, but also improves the adhesion between the first resin 6 and the phosphor 7.

Examples of coupling agents that may be used include silane coupling agents, titanate-based coupling agents and aluminate-based coupling agents. The coupling treatment may be performed after transparent film formation if required.

<Conductive Inorganic Materials>

In those cases where the phosphor 7 is excited using an electron beam, a conductive inorganic material may be mixed with the phosphor to impart conductivity to the phosphor 7.

Examples of this conductive inorganic material include oxides, oxynitrides or nitrides containing one or more elements selected from among Zn, Al, Ga, In and Sn, or mixtures of two or more of these materials.

<Inorganic Phosphors and Fluorescent Dyes>

If required, an inorganic phosphor or fluorescent dye that emits light of a different color from the light emission color of the above-mentioned fluorescent material may be mixed with the phosphor 7. This technique can be used to further improve the light emission brightness of the illumination device for a display device, or to alter the light emission color.

As the phosphor 7, a red light-emitting fluorescent material is preferably used in addition to the above-mentioned fluorescent material. For example, a red light-emitting fluorescent material composed of $CaAlSiN_3:Eu$ is preferably also included in the phosphor 7.

In an illumination device for a display device that uses a blue light-emitting LED chip 4, and in which the phosphor 7 includes not only the above-mentioned fluorescent material, but also a phosphor composed of $CaAlSiN_3:Eu$, a white light emission can be achieved by mixing the blue light emission of the LED chip 4, the green light emission of the phosphor 7 that employs the blue light emission as the excitation light source, and the red light emission from the red light-emitting phosphor that also employs the blue light emission as the excitation light source. By adopting this configuration, the light emission intensity can be improved in a wavelength region that generally suffers from low light emission intensity. In addition, the phosphor 7 exhibits excellent heat resistance, undergoing no deterioration even when exposed to high temperatures, and also displays excellent long-term stability under oxidizing environments and high-moisture environments.

Although there are no particular limitations on the method used for producing the phosphor 7, one possible method includes a step of kneading the raw materials to prepare a raw material mixture (a kneading step), a step of calcining the raw material mixture (a calcination step), a step of grinding and classifying the lumps of the calcined raw material mixture (a first grinding and classification step), a step of heat-treating the calcined raw material mixture (a heat treatment step), and a step of grinding and classifying the lumps of the heat-treated product (a second grinding and classification step). The first and second grinding and classification steps may be omitted if desired.

The white light-emitting devices 200 of the display device illumination device 221 were described as including a single LED chip 4, but may also have a structure that includes a plurality of LED chips 4. Such a structure enables the light emission brightness to be further increased.

Because the temperature-resistant light emission characteristics of the phosphor 7 contained within the white light-emitting devices 200 of the display device illumination device 221 are favorable, the white light-emitting devices 200 can be used without any particular problems in usage methods that generate large amounts of heat, and can be used at high brightness levels. For example, the white light-emitting devices 200 may be used with a supplied electric power of at least 0.2 W for each package. Furthermore, for similar reasons, the LED chips 4 may be used with a supplied electric power that is equivalent to a surface area density of at least $1.5 \times 10^4$ W/m² for each package, or even a supplied electric power of at least $5 \times 10^4$ W/m².

Examples of cases in which the illumination device is used at high brightness with a large amount of supplied electric power include cases where the LED chip 4 has a surface area in which the length of one side exceeds 350 μm, cases where a plurality of LED chips 4 are included, and cases where the LED chip 4 is a flip-chip structure.

The display device illumination device 221 that represents an embodiment of the present invention is formed from the substrate 214 and the plurality of white light-emitting devices 200 disposed on top of the substrate 214, and can be used as a backlight for the liquid crystal display panel 211, wherein each of the white light-emitting devices 200 includes the light source 40 and the phosphor 7 that is excited by the light source 40 and emits light, a fluorescent material with a composition represented by the general formula: $M(0)_a M(1)_b M(2)_{x-(vm+n)} M(3)_{(vm+n)-y} O_n N_{z-n}$ is used as the phosphor 7, wherein M(0) represents one or more elements selected from the group consisting of Li, Na, Be, Mg, Ca, Sr, Ba, Sc, Y, La, Gd and Lu, M(1) represents one or more activators selected from the group consisting of Mn, Ce, Pr, Nd, Sm, Eu, Tb, Dy, Ho, Er, Tm and Yb, M(2) represents one or more elements selected from the group consisting of Si, Ge, Sn, Ti, Hf and Zr, M(3) represents one or more elements selected from the group consisting of Be, B, Al, Ga, In, Tl and Zn, O represents the element oxygen, N represents the element nitrogen, x, y and z are numbers that satisfy $33 \leq x \leq 51$, $8 \leq y \leq 12$ and $36 \leq z \leq 56$ respectively, a and b are numbers that satisfy $3 \leq a+b \leq 7$ and $0.001 \leq b \leq 1.2$, m and n are numbers which, when me=a+b, satisfy $0.8 \cdot me \leq m \leq 1.2 \cdot me$ and $0 \leq n \leq 7$, and v is a number which satisfies $v = \{a \cdot v(0) + b \cdot v(1)\}/(a+b)$ (wherein v(0) represents the valency of an M(0) ion and v(1) represents the valency of an M(1) ion), and the phosphor 7 has a higher light emission intensity than conventional sialon or oxynitride phosphors, and therefore the light emission intensity can be increased to obtain a high-brightness illumination device for a display device. Further, because the phosphor 7 suffers minimal deterioration in brightness even when exposed to an excitation source, a long-life illumination device for a display device can be obtained. Moreover, the emission peak wavelength of the phosphor 7 is within a range from 330 to 500 nm, meaning the light emission can be moved closer to the ideal chromaticity coordinates for green-colored light, and as a result, a display device illumination device and a display device that exhibit excellent color reproducibility can be obtained.

The display device illumination device 221 that represents one embodiment of the present invention has a structure that employs an above-mentioned fluorescent material in which the M(1) element is Eu and the value of b satisfies $0.005 \leq b \leq 0.3$, and as a result, the emission peak wavelength from the fluorescent material is near 520 nm, and the chromaticity coordinates for this wavelength can be moved closer to the ideal chromaticity coordinates for green-colored light. Accordingly, the color reproducibility of a display device that uses this display device illumination device can be further improved.

The display device illumination device 221 that represents one embodiment of the present invention has a structure that employs an above-mentioned fluorescent material in which the M(1) element is Eu and the value of b satisfies $0.01 \leq b \leq 0.2$, and as a result, the emission peak wavelength from the fluorescent material is near 520 nm, and the chromaticity coordinates for this wavelength can be moved closer to the ideal chromaticity coordinates for green-colored light. Accordingly, the color reproducibility of a display device that uses this display device illumination device can be further improved.

The display device illumination device 221 that represents one embodiment of the present invention has a structure in which the values of x, y and z in the fluorescent material are x=42, y=10 and z=46 respectively, and as a result, a display device illumination device and a display device that exhibit high brightness, long life, and excellent color reproducibility can be obtained.

The display device illumination device 221 that represents one embodiment of the present invention has a structure in which the M(0) element of the fluorescent material is one or more elements selected from among Ca, Sr and Ba, and as a result, a display device illumination device and a display device that exhibit high brightness, long life, and excellent color reproducibility can be obtained.

The display device illumination device 221 that represents one embodiment of the present invention has a structure in which the M(2) element of the fluorescent material is Si and the M(3) element is Al, and as a result, a display device illumination device and a display device that exhibit high brightness, long life, and excellent color reproducibility can be obtained.

The display device illumination device 221 that represents one embodiment of the present invention has a structure in which the value of n in the fluorescent material satisfies $n \leq me$, and as a result, a display device illumination device and a display device that exhibit high brightness, long life, and excellent color reproducibility can be obtained.

The display device illumination device 221 that represents one embodiment of the present invention has a structure that employs a phosphor 7 in which the amount of the above-mentioned fluorescent material is not less than 80% by volume, and the remainder is composed of one or more substances selected from the group consisting of β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_n N_{(32-n)}$ (n~1) and $SrSi_6N_8$, and as a result, a display device illumination device and a display device that exhibit high brightness, long life, and excellent color reproducibility can be obtained.

The display device illumination device 221 that represents one embodiment of the present invention has a structure in which the average particle size of the phosphor 7 is not less than 0.1 μm and not more than 50 μm, and as a result, a display device illumination device and a display device that exhibit high brightness, long life, and excellent color reproducibility can be obtained.

The display device illumination device 221 that represents one embodiment of the present invention has a structure in which the average aspect ratio of the phosphor 7 is not more than 20, and as a result, a display device illumination device and a display device that exhibit high brightness, long life, and excellent color reproducibility can be obtained.

The display device illumination device 221 that represents one embodiment of the present invention has a structure in which the phosphor 7 contains 5 to 300 ppm of fluorine, and as a result, a display device illumination device and a display device that exhibit high brightness, long life, and excellent color reproducibility can be obtained.

The display device illumination device 221 that represents one embodiment of the present invention has a structure in which the phosphor 7 contains 10 to 3,000 ppm of boron, and as a result, a display device illumination device and a display device that exhibit high brightness, long life, and excellent color reproducibility can be obtained.

The display device illumination device 221 that represents one embodiment of the present invention has a structure in which a transparent film is formed at least partially on a surface of the phosphor 7, wherein if the refractive index of the transparent film is termed $n_k$, then the thickness of the transparent film is within a range from (10 to 180)/$n_k$ (units: nanometers), and as a result, a display device illumination device and a display device that exhibit high brightness, long life, and excellent color reproducibility can be obtained.

The display device illumination device 221 that represents one embodiment of the present invention has a structure in which the refractive index $n_k$ of the above-mentioned transparent film is not less than 1.2 and not more than 2.5, and as a result, a display device illumination device and a display device that exhibit high brightness, long life, and excellent color reproducibility can be obtained.

The display device illumination device 221 that represents one embodiment of the present invention has a structure in which the refractive index $n_k$ of the above-mentioned transparent film is not less than 1.5 and not more than 2.0, and as a result, a display device illumination device and a display device that exhibit high brightness, long life, and excellent color reproducibility can be obtained.

The display device illumination device 221 that represents one embodiment of the present invention has a structure in which, as the phosphor 7, a red light-emitting fluorescent material is used in addition to the above-mentioned fluorescent material, and as a result, a display device illumination device and a display device that exhibit high brightness, long life, and excellent color reproducibility can be obtained.

The display device illumination device 221 that represents one embodiment of the present invention has a structure in which the above-mentioned red light-emitting fluorescent material is $CaAlSiN_3$:Eu, and as a result, a display device illumination device and a display device that exhibit high brightness, long life, and excellent color reproducibility can be obtained.

The display device illumination device 221 that represents one embodiment of the present invention has a structure in which the light source 40 is a blue light-emitting LED chip 4 with an emission peak wavelength of 330 to 500 nm, and as a result, a display device illumination device and a display device that exhibit high brightness, long life, and excellent color reproducibility can be obtained.

The display device illumination device 221 that represents one embodiment of the present invention has a structure in which the emission peak wavelength of the LED chip 4 is within a range from 420 to 470 nm, and as a result, a display device illumination device and a display device that exhibit high brightness, long life, and excellent color reproducibility can be obtained.

The display device illumination device 221 that represents one embodiment of the present invention has a structure in which a white light emission is obtained from each of the white light-emitting devices 200 by mixing a blue light emission from the LED chip 4, a green light emission from the fluorescent material that has been excited by the blue light emission, and a red light emission from the above-mentioned red light-emitting fluorescent material that has been excited by the blue light emission, and as a result, a display device illumination device and a display device that exhibit high brightness, long life, and excellent color reproducibility can be obtained.

The display device illumination device 221 that represents one embodiment of the present invention has a structure in which each of the white light-emitting devices 200 is a bullet white LED device 1, and as a result, a display device illumination device and a display device that exhibit high brightness, long life, and excellent color reproducibility can be obtained. Further, because devices of this type of configuration have established standards and are widely used, industrial use of the devices is comparatively simple.

The display device illumination device 221 that represents one embodiment of the present invention has a structure in which the bullet white LED device 1 has a reflector surface that reflects the light emitted from the LED chip 4 in a frontal direction f, and as a result, a display device illumination device and a display device that exhibit high brightness, long life, and excellent color reproducibility can be obtained.

The display device illumination device 221 that represents one embodiment of the present invention has a structure in which each of the white light-emitting devices 200 has an LED chip 4 and a resin formed surrounding the LED chip 4, wherein the phosphor 7 is dispersed within the resin, and as a result, a display device illumination device and a display device that exhibit high brightness, long life, and excellent color reproducibility can be obtained.

The display device illumination device 221 that represents one embodiment of the present invention has a structure in which the phosphor 7 is dispersed within the above-mentioned resin so as to exist in a high density near the LED chip 4, and as a result, a display device illumination device and a display device that exhibit high brightness, long life, and excellent color reproducibility can be obtained. Further, by positioning the phosphor 7 near the LED chip 4, the excitation light can be irradiated efficiently onto the phosphor 7.

The display device illumination device 221 that represents one embodiment of the present invention has a structure in which the resin is composed of a first resin 6 that is formed so as to cover the LED chip 4 and a second resin 8 that is formed so as to cover the first resin 6, wherein the phosphor 7 is dispersed within the first resin 6, and as a result, a display device illumination device and a display device that exhibit high brightness, long life, and excellent color reproducibility can be obtained.

The display device illumination device 221 that represents one embodiment of the present invention has a structure in which the above-mentioned resin contains a silicone resin within at least some regions, and as a result, a display device illumination device and a display device that exhibit high brightness, long life, and excellent color reproducibility can be obtained.

The display device illumination device 221 that represents one embodiment of the present invention has a structure in which the above-mentioned resin contains a methyl silicone resin within at least some regions, and as a result, a display device illumination device and a display device that exhibit high brightness, long life, and excellent color reproducibility can be obtained.

The display device illumination device 221 that represents one embodiment of the present invention has a structure in which the above-mentioned resin contains a phenyl silicone resin within at least some regions, and as a result, a display device illumination device and a display device that exhibit high brightness, long life, and excellent color reproducibility can be obtained.

The display device illumination device 221 that represents one embodiment of the present invention has a structure in which one side of the LED chip 4 is larger than 350 μm, and as a result, a display device illumination device and a display device that exhibit high brightness, long life, and excellent color reproducibility can be obtained.

The display device illumination device 221 that represents one embodiment of the present invention has a structure in which a plurality of LED chips 4 are provided, and as a result, a display device illumination device and a display device that exhibit high brightness, long life, and excellent color reproducibility can be obtained.

The display device illumination device 221 that represents one embodiment of the present invention is used with a supplied electric power of not less than 0.2 W for each package, and as a result, a display device illumination device and a display device that exhibit high brightness, long life, and excellent color reproducibility can be obtained.

The display device illumination device 221 that represents one embodiment of the present invention has a structure in which the LED chip 4 is used with a supplied electric power for each package of the white light-emitting device 1 that is equivalent to a surface area density of not less than $1.5 \times 10^4$ W/m² for each LED chip, and as a result, a display device illumination device and a display device that exhibit high brightness, long life, and excellent color reproducibility can be obtained.

The display device illumination device 221 that represents one embodiment of the present invention has a structure in which the LED chip 4 is used with a supplied electric power for each package of the white light-emitting device 1 that is equivalent to a surface area density of not less than $5 \times 10^4$ W/m² for each LED chip, and as a result, a display device illumination device and a display device that exhibit high brightness, long life, and excellent color reproducibility can be obtained.

The display device 201 that represents one embodiment of the present invention has a structure that includes the display device illumination device 221 and the liquid crystal display panel 211, and as a result, a display device that exhibits high brightness, long life, and excellent color reproducibility can be obtained.

(Second Embodiment)

Figure 4:
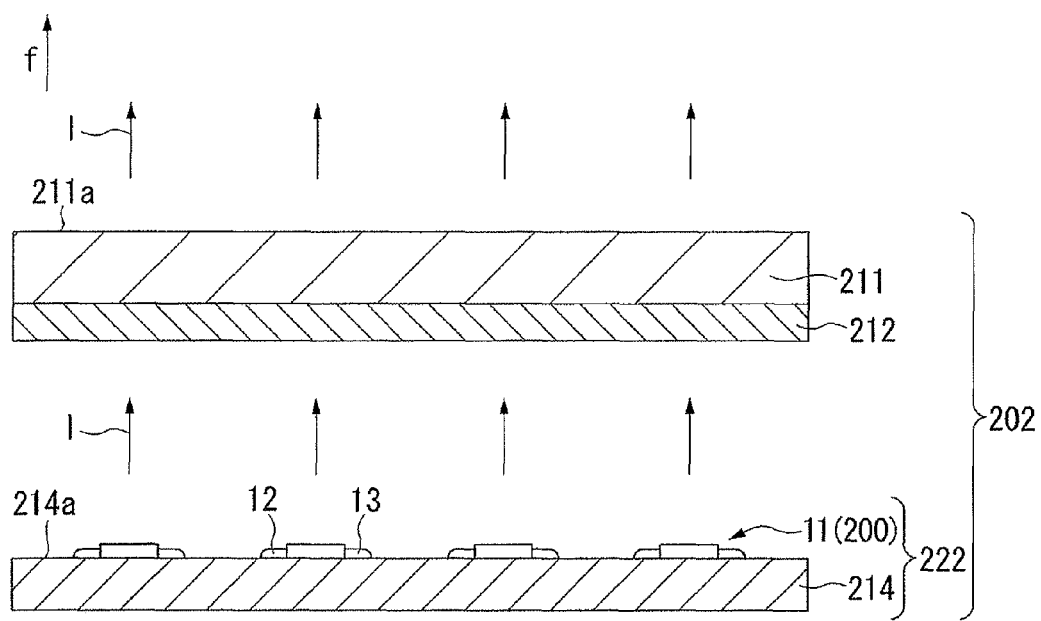
FIG. 4 is a cross-sectional view of an illumination device for a display device and a display device that represent a second embodiment of the present invention.
Figure 5:
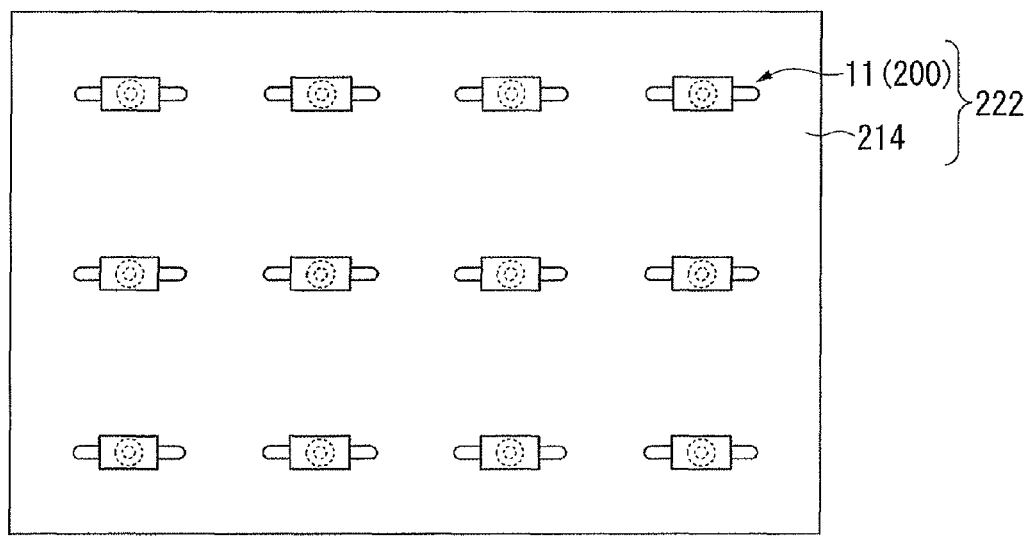
FIG. 5 is a plan view of the illumination device for a display device according to the second embodiment of the present invention.

FIG. 4 is a cross-sectional schematic view describing another example of a display device according to an embodiment of the present invention, and FIG. 5 is a plan view of the illumination device for a display device used in forming the display device.

As illustrated in FIG. 4 and FIG. 5, a display device 202 of this embodiment of the present invention has a similar structure to the display device 201 according to the first embodiment, with the exception of using a display device illumination device 222 in which surface-mounted white LED devices (chip-type white light-emitting diode lamps for substrate mounting) 11 are used instead of the bullet white LED devices 1 as the white light-emitting devices 200. Those members that are the same as members used in the first embodiment are labeled with the same symbols.

As illustrated in FIG. 4, the surface-mounted white LED devices 11 are mounted to the substrate 214 via a first lead wire 12 and a second lead wire 13.

Figure 6:
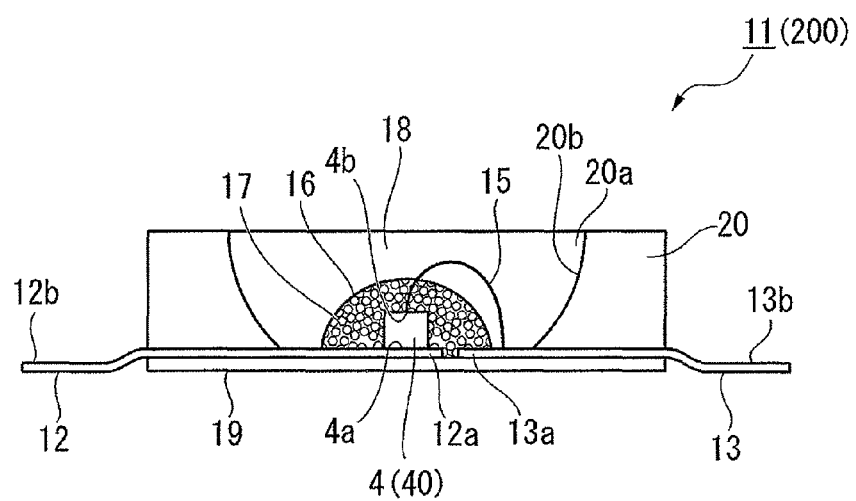
FIG. 6 is a cross-sectional view of a white light-emitting device used within the illumination device for a display device according to the second embodiment of the present invention.

FIG. 6 is a cross-sectional view of a surface-mounted white LED device 11 that functions as the white light-emitting device 200.

As illustrated in FIG. 6, in the surface-mounted white LED device 11, the first lead wire 12 and the second lead wire 13 are secured to a substrate 19, which uses a white alumina ceramic with a high visible light reflectance that has been molded using a nylon resin. The tips 12a and 13a of the first lead wire 12 and the second lead wire 13 respectively are positioned in substantially the central portion of the substrate 19, whereas the opposite ends 12b and 13b protrude externally and function as the electrodes that are soldered during mounting to the substrate 214.

The tip 12a of the first lead wire 12 is secured to the central portion of the substrate, and a light-emitting diode element (LED chip) 4 is mounted thereon. The bottom electrode 4a of the LED chip 4 and the first lead wire 12 are electrically connected via a conductive resin paste, and the top electrode 4b and the second lead wire 13 are electrically connected via a silver-plated copper bonding wire 15.

A substantially rectangular-shaped wall member 20 is fixed to the substrate 19. A bowl-shaped hole 20a is formed in the central portion of this wall member 20. This hole 20a is a through-hole, and the LED chip 4 positioned on top of the substrate 19 protrudes from the center of the hole 20a.

The portion of the hole 20a facing the center is formed as a reflector surface 20b for extracting the light in the frontal direction f, and the curved shape of this reflector surface 20b is determined with due consideration of the direction of reflection. The wall member 20 may be formed, for example, from a white silicone resin or the like. This ensures that at least the reflector surface 20b that constitutes the overall reflective surface is a surface with a high visible light reflectance having a white or metallic luster.

A first resin 16 composed of a transparent resin is formed in a dome shape so as to surround the LED chip 4 that has been positioned so as to protrude from the center of the hole 20a. A phosphor 17 is dispersed within this first resin 16.

A second resin 18 composed of a transparent resin is used to fill the hole 20a, thereby covering the dome-shaped first resin 16. Accordingly, the LED chip 4 is encapsulated within the first resin 16 and the second resin 18.

The materials for the first resin 16 and the second resin 18 are preferably selected to minimize deterioration caused by ultraviolet light. Silicone resins are preferred, but other resins such as polycarbonate resins or epoxy resins, or other transparent materials such as glass may also be used. The first resin 16 and the second resin 18 may employ the same resin or different resins, although from the viewpoints of ease of production and achieving good adhesion, using the same resin is preferable.

As illustrated in the present embodiment, the method used for ensuring that the phosphor 17 is positioned near the LED chip 4 preferably involves first forming the first resin 16 containing the phosphor 17 so as to surround the LED chip 4, and subsequently encapsulating the entire structure so that the second resin 18 covers the first resin 16. This method is inexpensive and enables the encapsulation to be performed with excellent sealing properties. The first resin 16 preferably contains a silicone resin with superior heat resistance.

The wall member 20 and/or the substrate 19 preferably include a resin member and/or ceramic member. Resin members are inexpensive and can be mass-produced, and are therefore ideal. In terms of the variety of resin, resins that exhibit a high degree of heat resistance and high reflectance are preferable, and nylon resins and the like are desirable. Thermosetting resins also exhibit excellent heat resistance and can be mass-produced comparatively inexpensively, and are therefore also preferred. Further, ceramic members exhibit extremely superior heat resistance, and are therefore also desirable.

Further, a wiring board may be used as the substrate 19 for the surface-mounted white LED device 11, with the LED chip 4 mounted directly on the wiring board, so that the surface-mounted white LED device 11 is used as a chip-on-board device. In this case, a configuration can be adopted that is customized for the intended application, enabling the device to be used for applications that take best advantage of the excellent temperature characteristics of the present phosphor.

In addition to the same effects as those described above for the first embodiment, the display device illumination device 222 and the display device 202 according to the second embodiment of the present invention also display the effects described below.

The display device illumination device 222 that represents one embodiment of the present invention has a structure in which surface-mounted white LED devices 11 are used as the white light-emitting devices 200, and therefore the device exhibits excellent surface mounting properties, and a display device illumination device and display device that exhibit high brightness, long life, and excellent color reproducibility can be obtained with comparative ease. Further, because these surface-mounted white LED devices 11 have established standards and are widely used, industrial use of the devices is comparatively simple.

The display device illumination device 222 that represents one embodiment of the present invention has a structure in which each of the surface-mounted white LED devices 11 has a reflector surface 20b that reflects the light emitted from the LED chip 4 in the frontal direction f, and as a result, a display device illumination device and a display device that exhibit high brightness, long life, and excellent color reproducibility can be obtained.

The display device illumination device 222 that represents one embodiment of the present invention has a structure in which the wall member 20 of each of the surface-mounted white LED devices 11 contains a resin material and/or a ceramic member, and as a result, a display device illumination device and a display device that exhibit high brightness, long life, and excellent color reproducibility can be obtained. Resin members are inexpensive and can be mass-produced, and are therefore ideal. In terms of the variety of resin, resins that exhibit a high degree of heat resistance and high reflectance are preferable, and nylon resins and the like are desirable. Thermosetting resins also exhibit excellent heat resistance and can be mass-produced comparatively inexpensively, and are therefore also preferred. Further ceramic members exhibit extremely superior heat resistance, and are therefore also desirable.

The display device illumination device 222 that represents one embodiment of the present invention has a structure in which the above-mentioned resin material of the wall member 20 of each of the surface-mounted white LED devices 11 is a thermosetting resin material, and as a result, a display device illumination device and a display device that exhibit high brightness, long life, and excellent color reproducibility can be obtained.

Figure 7:
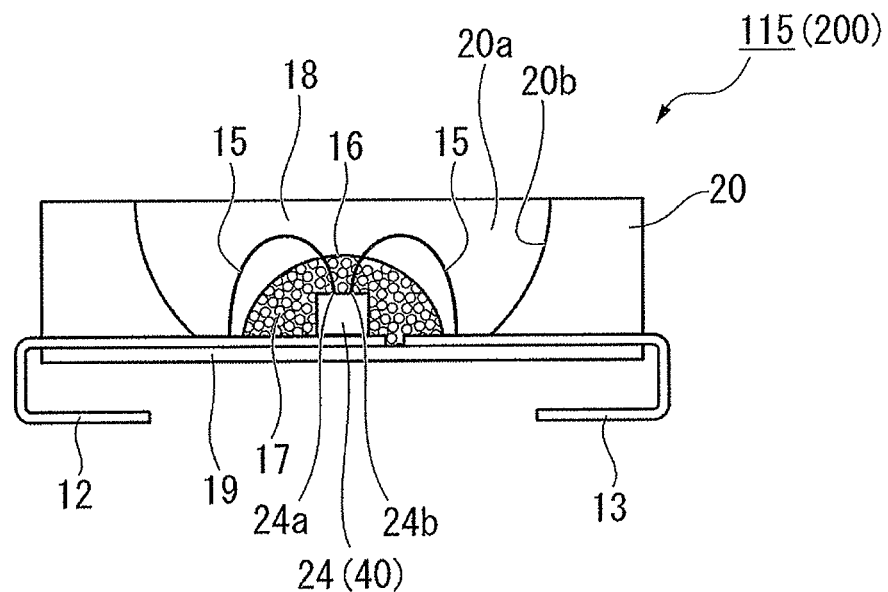
FIG. 7 is a cross-sectional view of a white light-emitting device used within the illumination device for a display device according to the second embodiment of the present invention.
Figure 8:
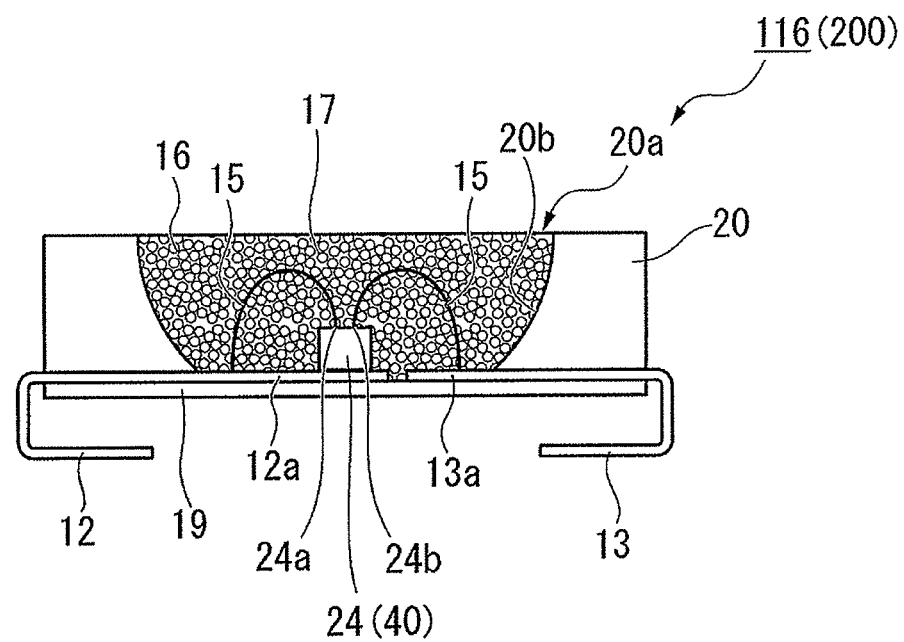
FIG. 8 is a cross-sectional view of a white light-emitting device used within the illumination device for a display device according to the second embodiment of the present invention.
Figure 9:
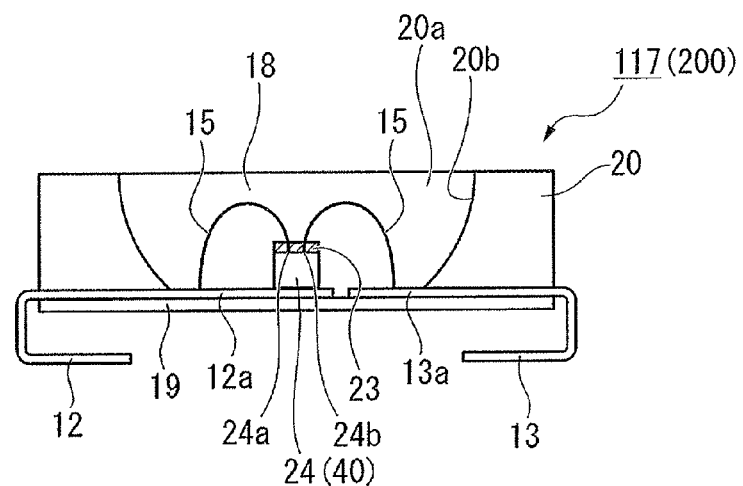
FIG. 9 is a cross-sectional view of a white light-emitting device used within the illumination device for a display device according to the second embodiment of the present invention.

In the present embodiment, chip-type white light-emitting diode lamps for substrate mounting 11 illustrated in FIG. 6 were used as the surface-mounted white LED devices that function as the white light-emitting devices 200, but other surface-mounted white LED devices (chip-type white light-emitting diode lamps for substrate mounting) 115 to 117 illustrated in FIG. 7 to FIG. 9 may also be used.

FIG. 7 is a diagram illustrating another example of the white light-emitting device 200 used in the display device illumination device 222 according to an embodiment of the present invention, and represents a cross-sectional view of a surface-mounted white LED device (chip-type white light-emitting diode lamp for substrate mounting) 115. With the exception of using a light-emitting diode element (LED chip) 24 having a same-surface electrode structure instead of the light-emitting diode element (LED chip) 4 having a top-bottom electrode structure, the device structure is the same as that of the surface-mounted white LED device 11 that functions as the white light-emitting device 200 used in the display device 202 according to the second embodiment.

FIG. 8 is a diagram illustrating yet another example of the white light-emitting device 200 used in the display device illumination device 222 according to an embodiment of the present invention, and represents a cross-sectional view of a surface-mounted white LED device (chip-type white light-emitting diode lamp for substrate mounting) 116. With the exceptions of using a light-emitting diode element (LED chip) 24 having a same-surface electrode structure, and dispersing the phosphor 17 throughout the entire hole 20a, the device structure is the same as that of the surface-mounted white LED device 11 that functions as the white light-emitting device 200 used in the display device 202 according to the second embodiment.

The surface-mounted white LED device 116 does not use the second resin 18, and simply has the phosphor 17 dispersed within the first resin 16, and therefore the device can be produced with comparative ease. As a result, the display device illumination device 222 and the display device 202 that use this device as the white light-emitting devices 200 can also be produced with ease.

FIG. 9 is a diagram illustrating yet another example of the white light-emitting device 200 used in the display device illumination device 222 according to an embodiment of the present invention, and represents a cross-sectional view of a surface-mounted white LED device (chip-type white light-emitting diode lamp for substrate mounting) 117. With the exceptions of using a light-emitting diode element (LED chip) 24 having a same-surface electrode structure, forming a layer-like phosphor 23 in which the phosphor is adhered directly so as to cover one surface of the LED chip 24, and forming the resin 18 so as to cover the LED chip 24 and fill the hole 20a within the wall member 20, the device structure is the same as that of the surface-mounted white LED device 11 that functions as the white light-emitting device 200 used in the display device 202 according to the second embodiment.

In terms of the method used for positioning the phosphor 23 close to the LED chip 24, a method such as that illustrated in the present embodiment may be used, wherein a technique such as spin coating, vacuum deposition or sputtering is used to deposit a uniform layer of the phosphor 23 onto at least one surface of the LED chip 24 at the wafer stage, thereby directly adhering the phosphor 23 in such a manner as to cover at least one surface of the LED chip 24.

With the above method, the thickness of the layer composed of the phosphor 23 can be controlled within a range from 1 μm to 100 μm, and light from the LED chip 24 is extracted following passage through the layer composed of the phosphor 23, which is ideal for ensuring color mixing to generate a white light.

The surface-mounted white LED device 117 has a structure in which the phosphor 23 is adhered directly in such a manner as to cover at least one surface of the LED chip 24, and as a result, a display device illumination device 222 and a display device 202 that exhibit high brightness, long life, and excellent color reproducibility can be obtained.

Further, the surface-mounted white LED device 117 has a structure in which the phosphor 23 is formed as a layer, and as a result, a display device illumination device 222 and a display device 202 that exhibit high brightness, long life, and excellent color reproducibility can be obtained.

Moreover, the surface-mounted white LED device 117 has a structure in which the thickness of the phosphor 23 is within a range from 1 μm to 100 μm, and as a result, a display device illumination device 222 and a display device 202 that exhibit high brightness, long life, and excellent color reproducibility can be obtained.

EXAMPLES

A more detailed description of the present invention is presented below based on a series of examples. However, the present invention is not limited solely to these examples.

Examples 1 to 10

First is a description of a method of producing phosphors of examples 1 to 10, which are used within the white light-emitting devices used in the display device illumination device and the display device according to the present invention.

Silicon nitride powder ($Si_3N_4$) having an average particle size of 0.5 μm, an oxygen content of 0.93% by mass and an α-type content of 92%, aluminum nitride powder (AlN), strontium nitride powder ($Sr_3N_2$), strontium oxide powder (SrO) and europium oxide powder ($Eu_2O_3$) were used as raw material powders.

The above-mentioned raw material powders were weighed and combined in each of the formulations (mass ratio, this also applies in the following examples) shown in Table 2, so as to obtain the values of a, b, m, x, y, z and n shown in Table 1 for the general formula: $M(0)_a M(1)_b M(2)_{x-(vm+n)} M(3)_{(vm+n)-y} O_n N_{z-n}$. The resulting raw material mixture was then mixed using an agate pestle and mortar for 30 minutes. M(1) was Eu.

TABLE 1

|  | a | b | m | x | y | z | n |
|---|---|---|---|---|---|---|---|
| Example 1 | 5.820 | 0.180 | 6.000 | 42.000 | 10.000 | 46.000 | 6.000 |
| Example 2 | 4.820 | 0.180 | 5.000 | 42.000 | 10.000 | 46.000 | 5.000 |
| Example 3 | 3.820 | 0.180 | 4.000 | 42.000 | 10.000 | 46.000 | 4.000 |
| Example 4 | 6.820 | 0.180 | 7.000 | 42.000 | 10.000 | 46.000 | 7.000 |
| Example 5 | 5.820 | 0.180 | 6.000 | 42.000 | 10.000 | 46.000 | 5.000 |
| Example 6 | 5.820 | 0.180 | 6.000 | 42.000 | 10.000 | 46.000 | 4.600 |
| Example 7 | 5.820 | 0.180 | 6.000 | 42.000 | 10.000 | 46.000 | 4.300 |
| Example 8 | 5.820 | 0.180 | 6.000 | 42.000 | 10.000 | 46.000 | 2.000 |
| Example 9 | 5.820 | 0.180 | 6.000 | 42.000 | 10.000 | 46.000 | 1.000 |
| Example 10 | 5.820 | 0.180 | 6.000 | 42.000 | 10.000 | 46.000 | 0.180 |

TABLE 2

|  | SrO (g) | $Sr_3N_2$ (g) | $Si_3N_4$ (g) | AlN (g) | $Eu_2O_3$ (g) | Emission intensity (count) | Emission wavelength (nm) |
|---|---|---|---|---|---|---|---|
| Example 1 | 2.893 | 0 | 5.383 | 1.573 | 0.152 | 100 | 504 |
| Example 2 | 2.499 | 0 | 6.317 | 1.026 | 0.158 | 97 | 504 |
| Example 3 | 2.070 | 0 | 7.336 | 0.429 | 0.166 | 93 | 503 |
| Example 4 | 3.255 | 0 | 4.523 | 2.077 | 0.146 | 90 | 502 |
| Example 5 | 2.397 | 0.465 | 5.609 | 1.377 | 0.152 | 96 | 504 |
| Example 6 | 2.198 | 0.651 | 5.7 | 1.298 | 0.152 | 101 | 504 |
| Example 7 | 2.049 | 0.791 | 5.768 | 1.240 | 0.152 | 103 | 505 |
| Example 8 | 0.906 | 1.864 | 6.29 | 0.788 | 0.152 | 102 | 505 |
| Example 9 | 0.408 | 2.33 | 6.518 | 0.591 | 0.152 | 98 | 506 |
| Example 10 | 0 | 2.713 | 6.705 | 0.430 | 0.152 | 96 | 507 |

Each of the obtained mixed powders was placed in an aluminum mold to form a compact having a bulk density of approximately 25%, and the resulting compact was then used to fill a boron nitride (hBN) crucible. The ratio between the compact volume and the crucible volume was approximately 80%. The steps of weighing the raw material powders, and then performing mixing and molding were all performed in a glove box, the inside of which was able to be maintained under a nitrogen atmosphere with a moisture content of not more than 1 ppm and an oxygen content of not more than 1 ppm.

The boron nitride crucible filled with the mixed powder was placed in the electric furnace of a graphite resistance heating system which employed a carbon fiber compact as the thermal insulation material.

In the calcination step, the calcination atmosphere was first evacuated using a diffusion pump, the powder was heated from room temperature to 1,000° C. at a rate of 500° C. per hour, nitrogen with a purity of 99.999% by volume was then introduced at 1,000° C. to adjust the pressure to 0.9 MPa, and the temperature was increased to 1,900° C. at a rate of 600° C. per hour and then held at 1,900° C. for two hours.

After the calcination step, the obtained calcined product (calcined mass) was subject to course grinding and then grinding by hand using a mortar of sintered silicon nitride, and a 30 μm sieve was then used to obtain a phosphor powder (of example 1 to 10) having an average particle size of 11 μm.

Next, the light emission spectrum and the excitation spectrum of each of the phosphor powders (of examples 1 to 10) were measured using a fluorescence spectrophotometer.

Figure 10:
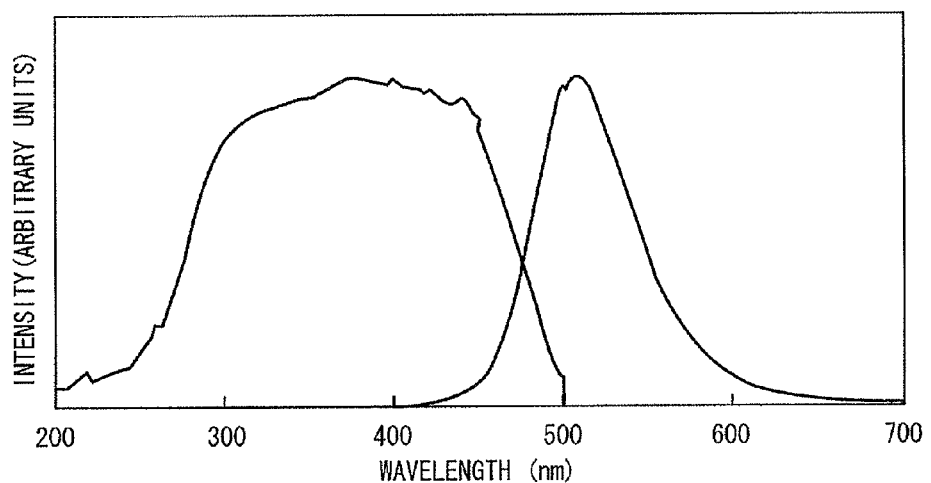
FIG. 10 is a diagram illustrating the light emission and excitation spectra for a phosphor of example 1 of the present invention.

FIG. 10 illustrates the results of measuring the light emission spectrum and the excitation spectrum of the phosphor of example 1.

As illustrated in FIG. 10, the peak wavelength within the excitation spectrum of the phosphor of example 1 was 370 nm, whereas the peak wavelength of the light emission spectrum generated by excitation with blue light of 450 nm was 504 nm.

Further, the light emission intensity at the peak wavelength was 100 counts.

Figure 11:
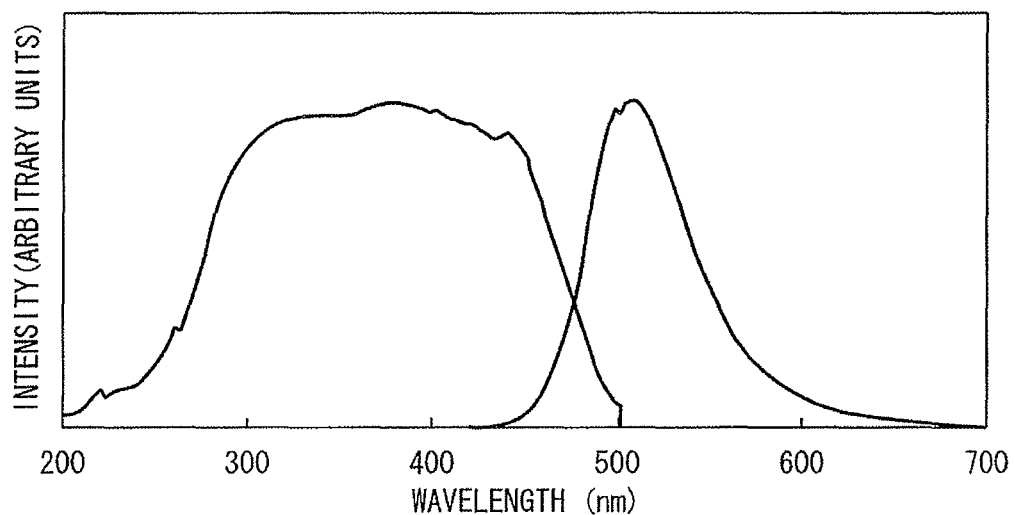
FIG. 11 is a diagram illustrating the light emission and excitation spectra for a phosphor of example 7 of the present invention.

FIG. 11 illustrates the results of measuring the light emission spectrum and the excitation spectrum of the phosphor of example 7.

As illustrated in FIG. 11, the peak wavelength within the excitation spectrum of the phosphor of example 1 was 370 nm, whereas the peak wavelength of the light emission spectrum generated by excitation with blue light of 450 nm was 504 nm.

Further, the light emission intensity at the peak wavelength was 103 counts.

The light emission intensity and emission wavelength at the light emission peak of each of the phosphor powders (of examples 1 to 10) are shown in Table 2. The count value for the light emission intensity has arbitrary units, and varies depending on the measurement device used and the measurement conditions (this also applies in the following description).

Figure 12:
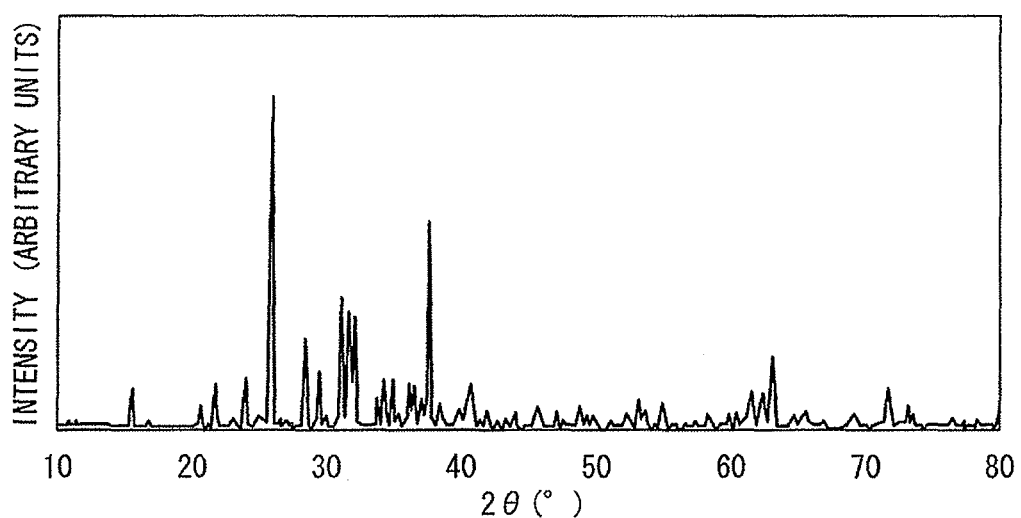
FIG. 12 is a diagram illustrating a powder X-ray diffraction chart for the phosphor of example 1 of the present invention.
Figure 13:
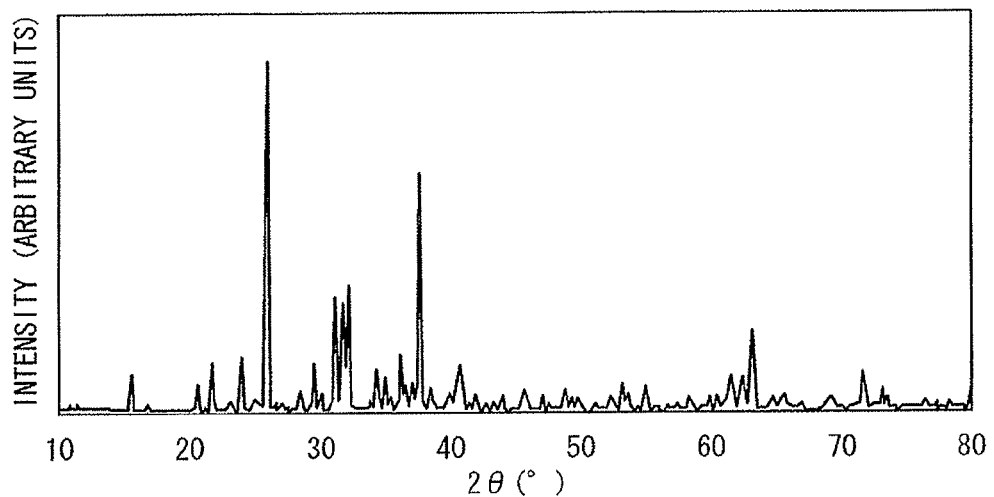
FIG. 13 is a diagram illustrating a powder X-ray diffraction chart for the phosphor of example 7 of the present invention.

FIG. 12 illustrates the results of measuring the powder X-ray diffraction pattern composed of the main diffraction peaks for the phosphor of example 1. FIG. 13 illustrates the results of measuring the powder X-ray diffraction pattern composed of the main diffraction peaks for the phosphor of example 7. In a similar manner to examples 1 and 7, powder X-ray diffraction patterns composed of the main diffraction peaks were also obtained for the phosphors of examples 2 to 6 and examples 8 to 10.

Each of the phosphor powders (of examples 1 to 10) was exposed for 100 hours to an environment having a humidity of 80% and a temperature of 80° C., but in each case, almost no decrease in brightness was observed.

Next, each of the phosphor powders (of examples 1 to 10) was observed using an optical microscope, if necessary while undergoing irradiation with ultraviolet light of 365 nm.

Based on the color of the samples, the particle shape, and the light emission color upon irradiation with ultraviolet light, it was confirmed that the volumetric ratio, relative to the total volume of the phosphor, of either a non-light emitting phase or a crystal phase that emits light different from the blue-green light near 504 nm, composed of one or more materials selected from among β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1) and $SrSi_6N_8$, was not more than 20% in each example.

A single crystal of the phosphor of example 1 was grown, and analysis of the crystal structure revealed that the phosphor had a crystal structure shown in Table 3 and Table 4. In Table 4, M(0,1) describes a site occupied randomly by the M(0) element or the M(1) element, M(2,3) describes a site occupied randomly by the M(2) element or the M(3) element, and M(O,N) describes a site occupied randomly by the element O or the element N.

TABLE 3

| Crystal system | monoclinic system |
|---|---|
| Space group | P1 21 1 |
| Lattice constant (a) | 14.6970(9) |
| Lattice constant (b) | 9.036(2) |
| Lattice constant (c) | 7.4677(7) |

TABLE 4

| Site | Occupancy | x | y | z |
|---|---|---|---|---|
| M(0, 1)1 | 1 | 0.08405 (5) | 0.517265 | −0.74677 (6) |
| M(0, 1)2 | 1 | 0.58104 (4) | −0.01664 (4) | 0.73684 (6) |
| M(0, 1)3 | 1 | 0.74895 (4) | 0.49871 (11) | −0.75193 (6) |
| M(2, 3)1 | 1 | 0.08979 (18) | 0.1903 (2) | −0.4430 (3) |
| M(2, 3)2 | 1 | 0.59158 (18) | 0.3117 (2) | 0.4431 (3) |
| M(2, 3)3 | 1 | 0.40898 (16) | 0.1656 (2) | −0.5106 (3) |
| M(2, 3)4 | 1 | 0.90852 (18) | 0.3403 (2) | 0.5148 (2) |
| M(2, 3)5a | 0.5 | 0.7776 (3) | 0.1668 (4) | −0.5103 (5) |
| M(2, 3)5b | 0.5 | 0.7223 (4) | 0.1841 (5) | 0.5570 (7) |
| M(2, 3)6a | 0.5 | 0.2770 (3) | 0.3383 (5) | 0.5136 (5) |
| M(2, 3)6b | 0.5 | 0.2215 (3) | 0.3178 (4) | 0.4420 (6) |
| M(2, 3)7 | 1 | 0.10065 (17) | 0.6428 (2) | −0.1522 (3) |
| M(2, 3)8 | 1 | 0.60206 (18) | −0.1604 (2) | 0.1383 (3) |
| M(2, 3)9 | 1 | 0.30049 (19) | 0.6408 (2) | −0.1370 (3) |
| M(2, 3)10 | 1 | 0.80168 (14) | −0.1554 (2) | 0.1266 (3) |
| M(2, 3)11 | 1 | 0.50024 (15) | 0.6374 (2) | −0.1348 (3) |
| M(2, 3)12 | 1 | 0.99998 (17) | −0.1517 (3) | 0.1244 (3) |
| M(2, 3)13 | 1 | 0.69884 (16) | 0.6390 (2) | −0.1447 (3) |
| M(2, 3)14 | 1 | 1.19840 (18) | −0.1546 (3) | 0.1310 (3) |
| M(2, 3)15 | 1 | 0.89924 (18) | 0.6473 (2) | −0.1430 (2) |
| M(2, 3)16 | 1 | 1.39950 (17) | −0.1617 (2) | 0.1320 (2) |
| M(O, N)1 | 1 | 0.4149 (7) | −0.0051 (9) | −0.4099 (6) |
| M(O, N)2 | 1 | 0.9157 (6) | 0.5041 (5) | 0.4086 (7) |
| M(O, N)3 | 1 | 0.7504 (7) | 0.0033 (10) | −0.4079 (7) |
| M(O, N)4 | 1 | 0.4979 (6) | 0.2285 (7) | −0.6514 (10) |
| M(O, N)5 | 1 | 0.9992 (4) | 0.2896 (6) | 0.6541 (8) |
| M(O, N)6 | 1 | 0.6897 (4) | 0.2283 (7) | −0.6545 (9) |
| M(O, N)7 | 1 | 1.1914 (5) | 0.2625 (7) | 0.6551 (10) |
| M(O, N)8 | 1 | 0.3109 (4) | 0.2058 (6) | −0.6424 (8) |
| M(O, N)9 | 1 | 0.8099 (5) | 0.2957 (10) | 0.6427 (11) |
| M(O, N)10a | 0.5 | 0.0949 (11) | 0.2415 (14) | 0.3398 (16) |
| M(O, N)10a | 0.5 | 0.1159 (8) | 0.2543 (11) | 0.3489 (14) |
| M(O, N)11a | 0.5 | 0.5942 (12) | 0.2572 (17) | 0.658 (2) |
| M(O, N)11b | 0.5 | 0.6148 (9) | 0.2608 (13) | 0.6613 (17) |
| M(O, N)12a | 0.5 | 0.8802 (10) | 0.2100 (15) | −0.6333 (18) |
| M(O, N)12b | 0.5 | 0.9034 (13) | 0.2001 (17) | −0.6352 (19) |
| M(O, N)13a | 0.5 | 0.3796 (8) | 0.3153 (11) | 0.6378 (14) |
| M(O, N)13b | 0.5 | 0.3996 (14) | 0.300 (2) | 0.645 (2) |
| M(O, N)14 | 1 | 1.1006 (4) | 0.2897 (5) | −0.0154 (6) |
| M(O, N)15 | 1 | 0.9996 (5) | 0.0389 (6) | −0.8842 (9) |
| M(O, N)16 | 1 | 0.7039 (5) | 0.2817 (6) | −0.0224 (8) |
| M(O, N)17 | 1 | 0.4979 (5) | 0.2704 (6) | −0.0287 (8) |
| M(O, N)18 | 1 | 0.4015 (5) | 0.0324 (5) | −0.8798 (6) |
| M(O, N)19 | 1 | 0.7982 (4) | 0.0367 (5) | −0.8784 (8) |
| M(O, N)20 | 1 | 0.2990 (5) | 0.2707 (6) | −0.0304 (9) |
| M(O, N)21 | 1 | 1.1996 (4) | 0.0389 (6) | −0.8933 (7) |
| M(O, N)22 | 1 | 0.6001 (5) | 0.0329 (4) | −0.9024 (6) |
| M(O, N)23 | 1 | 0.8990 (4) | 0.2760 (5) | −0.0207 (7) |

Examples 11 to 28

Examples 11 to 28 of phosphors of the present invention are described below.

Silicon nitride powder having an average particle size of 0.5 μm, an oxygen content of 0.93% by mass and an α-type content of 92%, aluminum nitride powder, strontium nitride powder, strontium oxide powder and europium oxide powder were used as raw material powders.

The above-mentioned raw material powders were weighed and combined in each of the formulations shown in Table 6, so as to obtain the values of a, b, m, x, y, z and n shown in Table 5 for the general formula: $M(0)_a M(1)_b M(2)_{x-(vm+n)} M(3)_{(vm+n)-y} O_n N_{z-n}$. The resulting raw material mixture was then mixed using an agate pestle and mortar for 30 minutes. M(1) was Eu.

TABLE 5

|  | a | b | m | x | y | z | n |
|---|---|---|---|---|---|---|---|
| Example 11 | 5.820 | 0.180 | 6.000 | 33.000 | 8.000 | 36.000 | 6.000 |
| Example 12 | 5.820 | 0.180 | 6.000 | 35.250 | 8.500 | 38.500 | 6.000 |
| Example 13 | 5.820 | 0.180 | 6.000 | 37.500 | 9.000 | 41.000 | 6.000 |
| Example 14 | 5.820 | 0.180 | 6.000 | 39.750 | 9.500 | 43.500 | 6.000 |
| Example 15 | 5.820 | 0.180 | 6.000 | 44.250 | 10.500 | 48.500 | 6.000 |
| Example 16 | 5.820 | 0.180 | 6.000 | 46.500 | 11.000 | 51.000 | 6.000 |
| Example 17 | 5.820 | 0.180 | 6.000 | 48.750 | 11.500 | 53.000 | 6.000 |
| Example 18 | 5.820 | 0.180 | 6.000 | 51.000 | 12.000 | 56.000 | 6.000 |
| Example 19 | 5.820 | 0.180 | 6.000 | 33.000 | 8.000 | 36.000 | 4.300 |
| Example 20 | 5.820 | 0.180 | 6.000 | 35.250 | 8.500 | 38.500 | 4.300 |
| Example 21 | 5.820 | 0.180 | 6.000 | 37.500 | 9.000 | 41.000 | 4.300 |
| Example 22 | 5.820 | 0.180 | 6.000 | 39.750 | 9.500 | 43.500 | 4.300 |
| Example 23 | 5.820 | 0.180 | 6.000 | 44.250 | 10.500 | 48.500 | 4.300 |
| Example 24 | 5.820 | 0.180 | 6.000 | 46.500 | 11.000 | 51.000 | 4.300 |
| Example 25 | 5.820 | 0.180 | 6.000 | 48.750 | 11.500 | 53.500 | 4.300 |
| Example 26 | 5.820 | 0.180 | 6.000 | 51.000 | 12.000 | 56.000 | 4.300 |
| Example 27 | 5.820 | 0.180 | 6.000 | 45.000 | 12.000 | 48.000 | 6.000 |
| Example 28 | 2.820 | 0.180 | 3.000 | 33.000 | 8.000 | 36.000 | 3.000 |

TABLE 6

|  | SrO (g) | $Sr_3N_2$ (g) | $Si_3N_4$ (g) | AlN (g) | $Eu_2O_3$ (g) | Emission intensity (count) | Emission wavelength (nm) |
|---|---|---|---|---|---|---|---|
| Example 11 | 3.454 | 0 | 4.017 | 2.348 | 0.181 | 95 | 503 |
| Example 12 | 3.294 | 0 | 4.406 | 2.127 | 0.173 | 96 | 504 |
| Example 13 | 3.149 | 0 | 4.76 | 1.926 | 0.165 | 98 | 504 |
| Example 14 | 3.015 | 0 | 5.085 | 1.742 | 0.158 | 98 | 503 |
| Example 15 | 2.78 | 0 | 5.657 | 1.417 | 0.146 | 99 | 504 |
| Example 16 | 2.675 | 0 | 5.911 | 1.273 | 0.141 | 97 | 504 |
| Example 17 | 2.578 | 0 | 6.147 | 1.139 | 0.135 | 97 | 503 |
| Example 18 | 2.488 | 0 | 6.366 | 1.015 | 0.131 | 96 | 504 |
| Example 19 | 2.447 | 0.945 | 4.476 | 1.950 | 0.182 | 96 | 504 |
| Example 20 | 2.334 | 0.901 | 4.844 | 1.748 | 0.173 | 97 | 505 |
| Example 21 | 2.231 | 0.861 | 5.179 | 1.563 | 0.166 | 101 | 505 |
| Example 22 | 2.136 | 0.825 | 5.486 | 1.395 | 0.158 | 101 | 504 |
| Example 23 | 1.969 | 0.76 | 6.028 | 1.097 | 0.146 | 100 | 505 |
| Example 24 | 1.895 | 0.732 | 6.268 | 0.964 | 0.141 | 99 | 505 |
| Example 25 | 1.826 | 0.705 | 6.491 | 0.842 | 0.135 | 97 | 506 |
| Example 26 | 1.763 | 0.681 | 6.699 | 0.728 | 0.131 | 95 | 504 |
| Example 27 | 2.814 | 0 | 5.891 | 1.148 | 0.148 | 101 | 504 |
| Example 28 | 1.965 | 0 | 7.546 | 0.276 | 0.213 | 92 | 503 |

Each of the obtained mixed powders was placed in an aluminum mold to form a compact having a bulk density of approximately 26%, and the resulting compact was then used to fill a boron nitride crucible. The ratio between the compact volume and the crucible volume was approximately 80%. The steps of weighing the raw material powders, and then performing mixing and molding were all performed in a glove box, the inside of which was able to be maintained under a nitrogen atmosphere with a moisture content of not more than 1 ppm and an oxygen content of not more than 1 ppm.

The boron nitride crucible filled with the mixed powder was placed in the electric furnace of a graphite resistance heating system which employed a carbon fiber compact as the thermal insulation material.

In the calcination step, the calcination atmosphere was first evacuated using a diffusion pump, the powder was heated from room temperature to 1,000° C. at a rate of 500° C. per hour, nitrogen with a purity of 99.999% by volume was then introduced at 1,000° C. to adjust the pressure to 0.9 MPa, and the temperature was increased to 1,900° C. at a rate of 600° C. per hour and then held at 1,900° C. for two hours.

After the calcination step, the obtained calcined product was subject to course grinding and then grinding by hand using a mortar of sintered silicon nitride, and a 30 μm sieve was then used to obtain a phosphor powder (of example 11 to 28) having an average particle size of 12 μm.

First, the light emission spectrum and the excitation spectrum of each of these phosphor powders (of examples 11 to 28) were measured using a fluorescence spectrophotometer.

Figure 14:
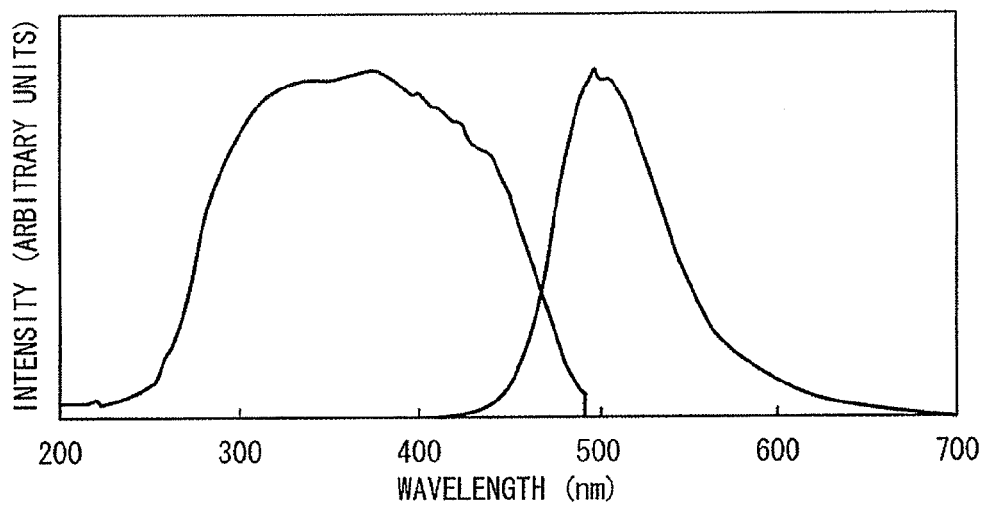
FIG. 14 is a diagram illustrating the light emission and excitation spectra for a phosphor of example 24 of the present invention.

FIG. 14 illustrates the results of measuring the light emission spectrum and the excitation spectrum of the phosphor of example 24. As illustrated in FIG. 14, the peak wavelength within the excitation spectrum of the phosphor of example 24 was 370 nm, whereas the peak wavelength of the light emission spectrum generated by excitation with blue light of 450 nm was 505 nm. Further, the light emission intensity at the peak wavelength was 99 counts.

Figure 15:
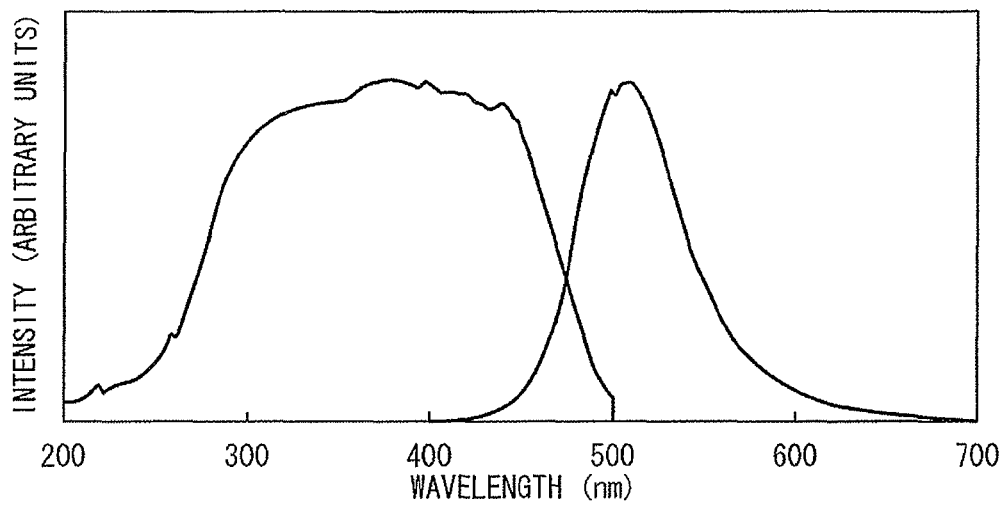
FIG. 15 is a diagram illustrating the light emission and excitation spectra for a phosphor of example 27 of the present invention.

FIG. 15 illustrates the results of measuring the light emission spectrum and the excitation spectrum of the phosphor of example 27. As illustrated in FIG. 15, the peak wavelength within the excitation spectrum of the phosphor of example 24 was 370 nm, whereas the peak wavelength of the light emission spectrum generated by excitation with blue light of 450 nm was 504 nm. Further, the light emission intensity at the peak wavelength was 101 counts.

The peak wavelength within the excitation spectrum of each of the phosphors was 370 nm, and excitation with blue light of 450 nm yielded a blue-green light emission in each case. The light emission intensity and emission wavelength at the light emission peak of each of the phosphor powders (of examples 11 to 28) are shown in Table 6. The count value for the light emission intensity has arbitrary units.

Figure 16:
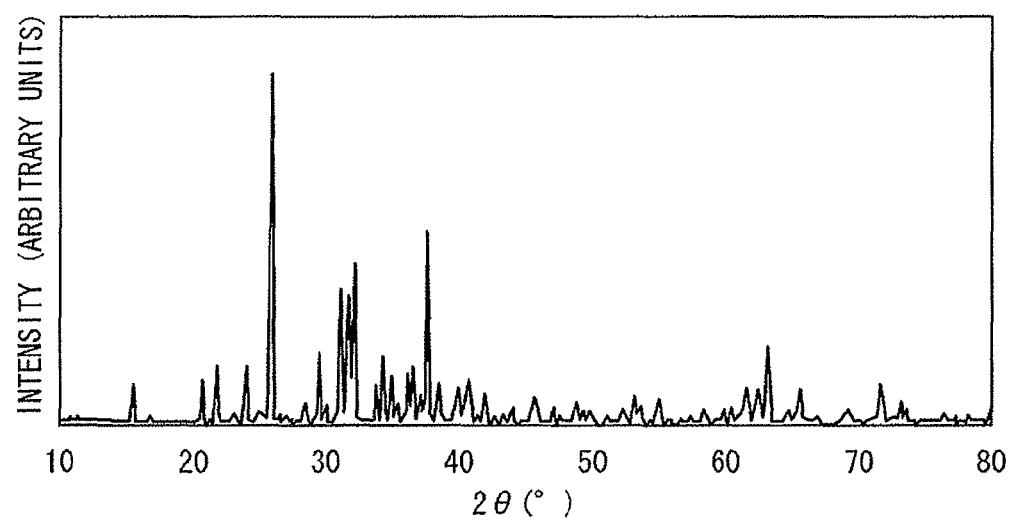
FIG. 16 is a diagram illustrating a powder X-ray diffraction chart for the phosphor of example 24 of the present invention.
Figure 17:
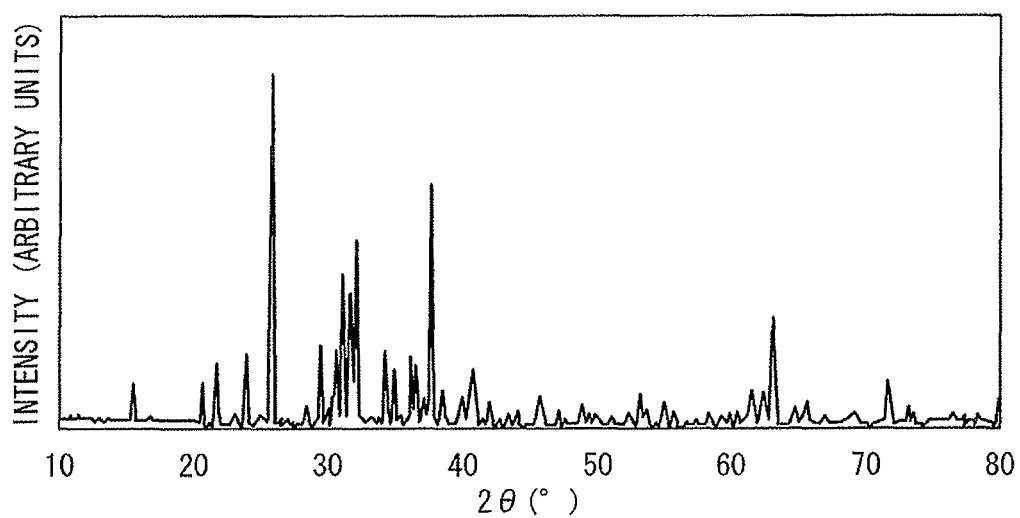
FIG. 17 is a diagram illustrating a powder X-ray diffraction chart for the phosphor of example 27 of the present invention.

FIG. 16 illustrates the results of measuring the powder X-ray diffraction pattern composed of the main diffraction peaks for the phosphor of example 24. FIG. 17 illustrates the results of measuring the powder X-ray diffraction pattern composed of the main diffraction peaks for the phosphor of example 27.

Further, in a similar manner to example 1, powder X-ray diffraction patterns composed of the main diffraction peaks were also obtained for the other phosphor powders (of examples 11 to 23, 25, 26 and 28)

Each of the phosphor powders (of examples 11 to 28) was exposed for 100 hours to an environment having a humidity of 80% and a temperature of 80° C., but in each case, almost no decrease in brightness was observed.

Next, each of the phosphor powders (of examples 11 to 28) was observed using an optical microscope, if necessary while undergoing irradiation with ultraviolet light of 365 nm.

Based on the color of the samples, the particle shape, and the light emission color upon irradiation with ultraviolet light, it was confirmed that the volumetric ratio, relative to the total volume of the phosphor, of either a non-light emitting phase or a crystal phase that emits light different from the blue-green light near 504 nm, composed of one or more materials selected from among β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1) and $SrSi_6N_8$, was not more than 20% in each example.

Examples 29 to 44

Examples 29 to 44 of phosphors of the present invention are described below.

Silicon nitride powder having an average particle size of 0.5 μm, an oxygen content of 0.93% by mass and an α-type content of 92%, aluminum nitride powder, strontium nitride powder, strontium oxide powder and europium oxide powder were used as raw material powders.

The above-mentioned raw material powders were weighed and combined in each of the formulations shown in Table 8, so as to obtain the values of a, b, m, x, y, z and n shown in Table 7 for the general formula: $M(0)_a M(1)_b M(2)_{x-(vm+n)} M(3)_{(vm+n)-y} O_n N_{z-n}$. The resulting raw material mixture was then mixed using an agate pestle and mortar for 30 minutes. M(1) was Eu.

TABLE 7

| | a | b | m | x | y | z | n |
|---|---|---|---|---|---|---|---|
| Example 29 | 5.940 | 0.060 | 6.000 | 42.000 | 10.000 | 46.000 | 6.000 |
| Example 30 | 5.880 | 0.120 | 6.000 | 42.000 | 10.000 | 46.000 | 6.000 |
| Example 31 | 5.760 | 0.240 | 6.000 | 42.000 | 10.000 | 46.000 | 6.000 |
| Example 32 | 5.700 | 0.300 | 6.000 | 42.000 | 10.000 | 46.000 | 6.000 |
| Example 33 | 5.550 | 0.450 | 6.000 | 42.000 | 10.000 | 46.000 | 6.000 |
| Example 34 | 5.400 | 0.600 | 6.000 | 42.000 | 10.000 | 46.000 | 6.000 |
| Example 35 | 5.100 | 0.900 | 6.000 | 42.000 | 10.000 | 46.000 | 6.000 |
| Example 36 | 4.800 | 1.200 | 6.000 | 42.000 | 10.000 | 46.000 | 6.000 |
| Example 37 | 5.940 | 0.060 | 6.000 | 42.000 | 10.000 | 46.000 | 4.300 |
| Example 38 | 5.880 | 0.120 | 6.000 | 42.000 | 10.000 | 46.000 | 4.300 |
| Example 39 | 5.760 | 0.240 | 6.000 | 42.000 | 10.000 | 46.000 | 4.300 |
| Example 40 | 5.700 | 0.300 | 6.000 | 42.000 | 10.000 | 46.000 | 4.300 |
| Example 41 | 5.550 | 0.450 | 6.000 | 42.000 | 10.000 | 46.000 | 4.300 |
| Example 42 | 5.400 | 0.600 | 6.000 | 42.000 | 10.000 | 46.000 | 4.300 |
| Example 43 | 5.100 | 0.900 | 6.000 | 42.000 | 10.000 | 46.000 | 4.300 |
| Example 44 | 4.800 | 1.200 | 6.000 | 42.000 | 10.000 | 46.000 | 4.300 |

TABLE 8

| | SrO (g) | $Sr_3N_2$ (g) | $Si_3N_4$ (g) | AlN (g) | $Eu_2O_3$ (g) | Emission intensity (count) | Emission wavelength (nm) |
|---|---|---|---|---|---|---|---|
| Example 29 | 2.965 | 0 | 5.405 | 1.579 | 0.051 | 91 | 493 |
| Example 30 | 2.929 | 0 | 5.394 | 1.576 | 0.101 | 97 | 500 |
| Example 31 | 2.857 | 0 | 5.371 | 1.570 | 0.202 | 98 | 508 |
| Example 32 | 2.821 | 0 | 5.36 | 1.566 | 0.252 | 95 | 510 |
| Example 33 | 2.733 | 0 | 5.333 | 1.558 | 0.376 | 94 | 513 |
| Example 34 | 2.645 | 0 | 5.305 | 1.550 | 0.499 | 91 | 519 |
| Example 35 | 2.473 | 0 | 5.251 | 1.535 | 0.741 | 87 | 523 |
| Example 36 | 2.304 | 0 | 5.199 | 1.519 | 0.978 | 84 | 526 |
| Example 37 | 2.118 | 0.795 | 5.792 | 1.245 | 0.051 | 93 | 494 |
| Example 38 | 2.083 | 0.793 | 5.78 | 1.242 | 0.102 | 100 | 502 |
| Example 39 | 2.015 | 0.79 | 5.756 | 1.237 | 0.202 | 102 | 508 |
| Example 40 | 1.981 | 0.788 | 5.744 | 1.234 | 0.252 | 100 | 512 |
| Example 41 | 1.897 | 0.784 | 5.714 | 1.228 | 0.377 | 97 | 516 |
| Example 42 | 1.814 | 0.78 | 5.685 | 1.222 | 0.5 | 93 | 521 |
| Example 43 | 1.650 | 0.772 | 5.627 | 1.209 | 0.742 | 92 | 524 |
| Example 44 | 1.489 | 0.764 | 5.571 | 1.197 | 0.979 | 89 | 528 |

Each of the obtained mixed powders was placed in an aluminum mold to form a compact having a bulk density of approximately 24%, and the resulting compact was then used to fill a boron nitride crucible. The ratio between the compact volume and the crucible volume was approximately 80%. The steps of weighing the raw material powders, and then performing mixing and molding were all performed in a glove box, the inside of which was able to be maintained under a nitrogen atmosphere with a moisture content of not more than 1 ppm and an oxygen content of not more than 1 ppm.

The boron nitride crucible filled with the mixed powder was placed in the electric furnace of a graphite resistance heating system which employed a carbon fiber compact as the thermal insulation material.

In the calcination step, the calcination atmosphere was first evacuated using a diffusion pump, the powder was heated from room temperature to 1,000° C. at a rate of 500° C. per hour, nitrogen with a purity of 99.999% by volume was then introduced at 1,000° C. to adjust the pressure to 0.9 MPa, and the temperature was increased to 1,900° C. at a rate of 600° C. per hour and then held at 1,900° C. for two hours.

After the calcination step, the obtained calcined product was subject to course grinding and then grinding by hand using a mortar of sintered silicon nitride, and a 30 μm sieve was then used to obtain a phosphor powder (of example 29 to 44) having an average particle size of 12 μm.

First, the light emission spectrum and the excitation spectrum of each of these phosphor powders (of examples 29 to 44) were measured using a fluorescence spectrophotometer.

The peak wavelength within the excitation spectrum of each of the phosphors was 370 nm, and excitation with blue light of 450 nm yielded a light emission with a color in the range from blue-green to green in each case. The light emission intensity and emission wavelength at the light emission peak of each of the phosphor powders (of examples 29 to 44) are shown in Table 8. The count value for the light emission intensity has arbitrary units.

Further, in a similar manner to example 1, powder X-ray diffraction patterns composed of the main diffraction peaks were obtained for each of the phosphor powders (of examples 29 to 44).

Each of the phosphor powders (of examples 29 to 44) was exposed for 100 hours to an environment having a humidity of 80% and a temperature of 80° C., but in each case, almost no decrease in brightness was observed.

Next, each of the phosphor powders (of examples 29 to 44) was observed using an optical microscope, if necessary while undergoing irradiation with ultraviolet light of 365 nm.

Based on the color of the samples, the particle shape, and the light emission color upon irradiation with ultraviolet light, it was confirmed that the volumetric ratio, relative to the total volume of the phosphor, of either a non-light emitting phase or a crystal phase that emits light different from the blue-green light near 504 nm, composed of one or more materials selected from among β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1) and $SrSi_6N_8$, was not more than 20% in each example.

Examples 45 to 56

Examples 45 to 56 of phosphors of the present invention are described below.

Silicon nitride powder having an average particle size of 0.5 μm, an oxygen content of 0.93% by mass and an α-type content of 92%, aluminum nitride powder, strontium nitride powder, strontium oxide powder, calcium oxide powder and europium oxide powder were used as raw material powders.

The above-mentioned raw material powders were weighed and combined in each of the formulations shown in Table 10, so as to obtain the values of a, b, m, x, y, z and n shown in Table 9 for the general formula: $M(0)_aM(1)_bM(2)_{x-(vm+n)}M(3)_{(vm+n)-y}O_nN_{z-n}$. The resulting raw material mixture was then mixed using an agate pestle and mortar for 30 minutes. M(1) was Eu.

TABLE 9

|  | a | | b | m | x | y | z | n |
|---|---|---|---|---|---|---|---|---|
|  | Sr | Ca | | | | | | |
| Example 45 | 0.000 | 5.820 | 0.180 | 6.000 | 42.000 | 10.000 | 46.000 | 6.000 |
| Example 46 | 0.820 | 5.000 | 0.180 | 6.000 | 42.000 | 10.000 | 46.000 | 6.000 |
| Example 47 | 1.820 | 4.000 | 0.180 | 6.000 | 42.000 | 10.000 | 46.000 | 6.000 |
| Example 48 | 2.820 | 3.000 | 0.180 | 6.000 | 42.000 | 10.000 | 46.000 | 6.000 |
| Example 49 | 3.820 | 2.000 | 0.180 | 6.000 | 42.000 | 10.000 | 46.000 | 6.000 |
| Example 50 | 4.820 | 1.000 | 0.180 | 6.000 | 42.000 | 10.000 | 46.000 | 6.000 |
| Example 51 | 5.320 | 0.500 | 0.180 | 6.000 | 42.000 | 10.000 | 46.000 | 6.000 |
| Example 52 | 1.820 | 4.000 | 0.180 | 6.000 | 42.000 | 10.000 | 46.000 | 4.300 |
| Example 53 | 2.820 | 3.000 | 0.180 | 6.000 | 42.000 | 10.000 | 46.000 | 4.300 |
| Example 54 | 3.820 | 2.000 | 0.180 | 6.000 | 42.000 | 10.000 | 46.000 | 4.300 |
| Example 55 | 4.820 | 1.000 | 0.180 | 6.000 | 42.000 | 10.000 | 46.000 | 4.300 |
| Example 56 | 5.320 | 0.500 | 0.180 | 6.000 | 42.000 | 10.000 | 46.000 | 4.300 |

TABLE 10

|  | SrO (g) | CaO (g) | $Sr_3N_2$ (g) | $Si_3N_4$ (g) | AlN (g) | $Eu_2O_3$ (g) | Emission intensity (count) | Emission wavelength (nm) |
|---|---|---|---|---|---|---|---|---|
| Example 45 | 0 | 1.805 | 0 | 6.206 | 1.814 | 0.175 | 88 | 570 |
| Example 46 | 0.46 | 1.518 | 0 | 6.075 | 1.775 | 0.171 | 91 | 563 |
| Example 47 | 0.995 | 1.184 | 0 | 5.923 | 1.731 | 0.167 | 94 | 548 |
| Example 48 | 1.505 | 0.866 | 0 | 5.778 | 1.688 | 0.163 | 96 | 532 |
| Example 49 | 1.989 | 0.564 | 0 | 5.64 | 1.648 | 0.159 | 97 | 523 |
| Example 50 | 2.452 | 0.275 | 0 | 5.508 | 1.61 | 0.155 | 99 | 511 |
| Example 51 | 2.675 | 0.136 | 0 | 5.445 | 1.591 | 0.154 | 99 | 507 |
| Example 52 | 0.066 | 1.185 | 0.871 | 6.347 | 1.364 | 0.167 | 92 | 551 |
| Example 53 | 0.598 | 0.867 | 0.849 | 6.192 | 1.331 | 0.163 | 96 | 533 |
| Example 54 | 1.105 | 0.564 | 0.829 | 6.044 | 1.299 | 0.159 | 97 | 526 |
| Example 55 | 1.588 | 0.276 | 0.81 | 5.903 | 1.269 | 1.156 | 99 | 512 |
| Example 56 | 1.821 | 0.136 | 0.8 | 5.835 | 1.254 | 0.154 | 100 | 508 |

Each of the obtained mixed powders was placed in an aluminum mold to form a compact having a bulk density of approximately 25%, and the resulting compact was then used to fill a boron nitride crucible. The ratio between the compact volume and the crucible volume was approximately 80%. The steps of weighing the raw material powders, and then performing mixing and molding were all performed in an open atmosphere.

The boron nitride crucible filled with the mixed powder was placed in the electric furnace of a graphite resistance heating system which employed a carbon fiber compact as the thermal insulation material.

In the calcination step, the calcination atmosphere was first evacuated using a diffusion pump, the powder was heated from room temperature to 1,000° C. at a rate of 500° C. per hour, nitrogen with a purity of 99.999% by volume was then introduced at 1,000° C. to adjust the pressure to 0.9 MPa, and the temperature was increased to 1,900° C. at a rate of 600° C. per hour and then held at 1,900° C. for two hours.

After the calcination step, the obtained calcined product was subject to course grinding and then grinding by hand using a mortar of sintered silicon nitride, and a 30 μm sieve was then used to obtain a phosphor powder (of example 45 to 56) having an average particle size of 12 μm.

First, the light emission spectrum and the excitation spectrum of each of these phosphor powders (of examples 45 to 56) were measured using a fluorescence spectrophotometer.

The peak wavelength within the excitation spectrum of each of the phosphors was 370 nm, and excitation with blue light of 450 nm yielded a light emission with a color in the range from blue-green to green in each case. The light emission intensity and emission wavelength at the light emission peak of each of the phosphor powders (of examples 45 to 56) are shown in Table 10. The count value for the light emission intensity has arbitrary units.

Further, in a similar manner to example 1, powder X-ray diffraction patterns composed of the main diffraction peaks were obtained for each of the phosphor powders (of examples 45 to 56).

Each of the phosphor powders (of examples 45 to 56) was exposed for 100 hours to an environment having a humidity of 80% and a temperature of 80° C., but in each case, almost no decrease in brightness was observed.

Next, each of the phosphor powders (of examples 45 to 56) was observed using an optical microscope, if necessary while undergoing irradiation with ultraviolet light of 365 nm.

Based on the color of the samples, the particle shape, and the light emission color upon irradiation with ultraviolet light, it was confirmed that the volumetric ratio, relative to the total volume of the phosphor, of either a non-light emitting phase or a crystal phase that emits light different from the blue-green light near 504 nm, composed of one or more materials selected from among β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1) and $SrSi_6N_8$, was not more than 20% in each example.

Examples 57 to 68

Examples 57 to 68 of phosphors of the present invention are described below.

Silicon nitride powder having an average particle size of 0.5 μm, an oxygen content of 0.93% by mass and an α-type content of 92%, aluminum nitride powder, strontium nitride powder, strontium oxide powder, barium oxide powder and europium oxide powder were used as raw material powders.

The above-mentioned raw material powders were weighed and combined in each of the formulations shown in Table 12, so as to obtain the values of a, b, m, x, y, z and n shown in Table 11 for the general formula: $M(0)_aM(1)_bM(2)_{x-(vm+n)}M(3)_{(vm+n)-y}O_nN_{z-n}$. The resulting raw material mixture was then mixed using an agate pestle and mortar for 30 minutes. M(1) was Eu.

TABLE 11

| | a | | b | m | x | y | z | n |
|---|---|---|---|---|---|---|---|---|
| | Sr | Ba | | | | | | |
| Example 57 | 0.000 | 5.820 | 0.180 | 6.000 | 42.000 | 10.000 | 46.000 | 6.000 |
| Example 58 | 0.820 | 5.000 | 0.180 | 6.000 | 42.000 | 10.000 | 46.000 | 6.000 |
| Example 59 | 1.820 | 4.000 | 0.180 | 6.000 | 42.000 | 10.000 | 46.000 | 6.000 |
| Example 60 | 2.820 | 3.000 | 0.180 | 6.000 | 42.000 | 10.000 | 46.000 | 6.000 |
| Example 61 | 3.820 | 2.000 | 0.180 | 6.000 | 42.000 | 10.000 | 46.000 | 6.000 |
| Example 62 | 4.820 | 1.000 | 0.180 | 6.000 | 42.000 | 10.000 | 46.000 | 6.000 |
| Example 63 | 5.320 | 0.500 | 0.180 | 6.000 | 42.000 | 10.000 | 46.000 | 6.000 |
| Example 64 | 1.820 | 4.000 | 0.180 | 6.000 | 42.000 | 10.000 | 46.000 | 4.300 |
| Example 65 | 2.820 | 3.000 | 0.180 | 6.000 | 42.000 | 10.000 | 46.000 | 4.300 |
| Example 66 | 3.820 | 2.000 | 0.180 | 6.000 | 42.000 | 10.000 | 46.000 | 4.300 |
| Example 67 | 4.820 | 1.000 | 0.180 | 6.000 | 42.000 | 10.000 | 46.000 | 4.300 |
| Example 68 | 5.320 | 0.500 | 0.180 | 6.000 | 42.000 | 10.000 | 46.000 | 4.300 |

TABLE 12

| | SrO (g) | BaO (g) | $Sr_3N_2$ (g) | $Si_3N_4$ (g) | AlN (g) | $Eu_2O_3$ (g) | Emission intensity (count) | Emission wavelength (nm) |
|---|---|---|---|---|---|---|---|---|
| Example 57 | 0 | 3.758 | 0 | 4.727 | 1.381 | 0.133 | 113 | 446 |
| Example 58 | 0.364 | 3.285 | 0 | 4.809 | 1.405 | 0.136 | 110 | 453 |
| Example 59 | 0.826 | 2.685 | 0 | 4.914 | 1.436 | 0.139 | 107 | 463 |
| Example 60 | 1.308 | 2.059 | 0 | 5.023 | 1.468 | 0.142 | 106 | 475 |
| Example 61 | 1.812 | 1.404 | 0 | 5.138 | 1.501 | 0.145 | 103 | 486 |
| Example 62 | 2.34 | 0.718 | 0 | 5.257 | 1.536 | 0.148 | 101 | 498 |
| Example 63 | 2.613 | 0.363 | 0 | 5.319 | 1.554 | 0.15 | 100 | 503 |
| Example 64 | 0.054 | 2.687 | 0.722 | 5.266 | 1.132 | 0.139 | 109 | 465 |

TABLE 12-continued

|  | SrO (g) | BaO (g) | Sr$_3$N$_2$ (g) | Si$_3$N$_4$ (g) | AlN (g) | Eu$_2$O$_3$ (g) | Emission intensity (count) | Emission wavelength (nm) |
| --- | --- | --- | --- | --- | --- | --- | --- | --- |
| Example 65 | 0.52 | 2.060 | 0.738 | 5.383 | 1.157 | 0.142 | 107 | 475 |
| Example 66 | 1.006 | 1.405 | 0.755 | 5.505 | 1.183 | 0.145 | 104 | 489 |
| Example 67 | 1.516 | 0.719 | 0.773 | 5.634 | 1.211 | 0.148 | 102 | 501 |
| Example 68 | 1.779 | 0.364 | 0.782 | 5.7 | 1.225 | 0.15 | 101 | 503 |

Each of the obtained mixed powders was placed in an aluminum mold to form a compact having a bulk density of approximately 23%, and the resulting compact was then used to fill a boron nitride crucible. The ratio between the compact volume and the crucible volume was approximately 80%. The steps of weighing the raw material powders, and then performing mixing and molding were all performed in an open atmosphere.

The boron nitride crucible filled with the mixed powder was placed in the electric furnace of a graphite resistance heating system which employed a carbon fiber compact as the thermal insulation material.

In the calcination step, the calcination atmosphere was first evacuated using a diffusion pump, the powder was heated from room temperature to 1,000° C. at a rate of 500° C. per hour, nitrogen with a purity of 99.999% by volume was then introduced at 1,000° C. to adjust the pressure to 0.9 MPa, and the temperature was increased to 1,900° C. at a rate of 600° C. per hour and then held at 1,900° C. for two hours.

After the calcination step, the obtained calcined product was subject to course grinding and then grinding by hand using a mortar of sintered silicon nitride, and a 30 μm sieve was then used to obtain a phosphor powder (of example 57 to 68) having an average particle size of 11 μm.

First, the light emission spectrum and the excitation spectrum of each of these phosphor powders (of examples 57 to 68) were measured using a fluorescence spectrophotometer.

The peak wavelength within the excitation spectrum of each of the phosphors was 370 nm, and excitation with blue-ultraviolet light of 400 nm yielded a light emission with a color in the range from blue to blue-green in each case. The light emission intensity and emission wavelength at the light emission peak of each of the phosphor powders (of examples 57 to 68) are shown in Table 12. The count value for the light emission intensity has arbitrary units.

Further, in a similar manner to example 1, powder X-ray diffraction patterns composed of the main diffraction peaks were obtained for each of the phosphor powders (of examples 57 to 68).

Each of the phosphor powders (of examples 57 to 68) was exposed for 100 hours to an environment having a humidity of 80% and a temperature of 80° C., but in each case, almost no decrease in brightness was observed.

Next, each of the phosphor powders (of examples 57 to 68) was observed using an optical microscope, if necessary while undergoing irradiation with ultraviolet light of 365 nm.

Based on the color of the samples, the particle shape, and the light emission color upon irradiation with ultraviolet light, it was confirmed that the volumetric ratio, relative to the total volume of the phosphor, of either a non-light emitting phase or a crystal phase that emits light different from the blue-green light near 504 nm, composed of one or more materials selected from among β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1) and $SrSi_6N_8$, was not more than 20% in each example.

Next is a description of display device illumination devices and display devices that use the phosphors described above.

Example 69

Using an above-mentioned phosphor, a bullet white light-emitting diode lamp (white light-emitting device) illustrated in FIG. 3 was produced.

First, a conductive paste was used to bond a blue light-emitting diode element inside the element-mounting recessed section within the first lead wire, thereby electrically connecting the first lead wire and the bottom electrode of the blue light-emitting diode element, as well as securing the blue light-emitting diode element. Next, the top electrode of the blue light-emitting diode element and the second lead wire were wire-bonded and electrically connected using a bonding wire.

A resin having the phosphor dispersed therein, which had been prepared in advance, was then injected into the recessed section with a dispenser, in an appropriate amount sufficient to cover the blue light-emitting diode element, and the resin was then cured to form the first resin.

Finally, a casting method was used to encapsulate, within a second resin, the tip of the first lead wire including the recessed section, the blue light-emitting diode element, and the entire first resin containing the phosphor dispersed therein.

An epoxy resin with a refractive index of 1.6 was used as the first resin, and an epoxy resin with a refractive index of 1.36 was used as the second resin.

In this example, 15% by mass of the phosphor of example 1 as a blue-green phosphor, and 26% by mass of a CaAlSiN$_3$:Eu phosphor as a red phosphor were mixed into the epoxy resin, and an appropriate amount of the resin was then applied using a dispenser to form the first resin having the phosphors dispersed therein.

An illumination device for a display device was produced in which the above white light-emitting devices were arrayed in a grid on a substrate. Further, a display device that used this illumination device as a backlight was also produced. When a current was passed through the conductive terminals, each of the LED elements emitted a blue light having an emission peak wavelength of 450 nm, the phosphor of example 1 and the red phosphor were excited by this blue light and emitted a blue-green light and a red light respectively, and these light emissions were mixed to generate white light.

Example 70

With the exception of changing the phosphors used, a bullet white light-emitting diode lamp (white light-emitting device) shown in FIG. 3 was produced in the same manner as example 69.

In this example, 15% by mass of the phosphor of example 1 as a blue-green phosphor, 12% by mass of a β-sialon phosphor as a green phosphor, and 26% by mass of a CaAlSiN$_3$:Eu phosphor as a red phosphor were mixed into the epoxy resin, and an appropriate amount of the resin was then applied dropwise using a dispenser to form the first resin having the phosphors dispersed therein.

An illumination device for a display device was produced in which the above white light-emitting devices were arrayed in a grid on a substrate.

Further, a display device that used this illumination device as a backlight was also produced. When a current was passed through the conductive terminals, each of the LED elements emitted a blue light having an emission peak wavelength of 450 nm, the phosphor of example 1, the green phosphor and the red phosphor were excited by this blue light and emitted a blue-green light, a green light and a red light respectively, and these light emissions were mixed to generate white light.

Example 71

With the exception of changing the phosphors used, a bullet white light-emitting diode lamp (white light-emitting device) shown in FIG. 3 was produced in the same manner as example 69.

In this example, 15% by mass of the phosphor of example 1 as a blue-green phosphor, 13% by mass of a $Ca_3Sc_2Si_3O_{12}$:Ce phosphor as a green phosphor, and 26% by mass of a $CaAlSiN_3$:Eu phosphor as a red phosphor were mixed into the epoxy resin, and an appropriate amount of the resin was then applied dropwise using a dispenser to form the first resin having the phosphors dispersed therein.

An illumination device for a display device was produced in which the above white light-emitting devices were arrayed in a grid on a substrate.

Further, a display device that used this illumination device as a backlight was also produced. When a current was passed through the conductive terminals, each of the LED elements emitted a blue light having an emission peak wavelength of 450 nm, the phosphor of example 1, the green phosphor and the red phosphor were excited by this blue light and emitted a blue-green light, a green light and a red light respectively, and these light emissions were mixed to generate white light.

Example 72

With the exception of changing the phosphors used, a bullet white light-emitting diode lamp (white light-emitting device) shown in FIG. 3 was produced in the same manner as example 69.

In this example, 15% by mass of the phosphor of example 1 as a blue-green phosphor, 13% by mass of a β-sialon phosphor as a green phosphor, 18% by mass of a YAG:Ce phosphor as a yellow phosphor, and 26% by mass of a $CaAlSiN_3$:Eu phosphor as a red phosphor were mixed into the epoxy resin, and an appropriate amount of the resin was then applied dropwise using a dispenser to form the first resin having the phosphors dispersed therein.

An illumination device for a display device was produced in which the above white light-emitting devices were arrayed in a grid on a substrate.

Further, a display device that used this illumination device as a backlight was also produced. When a current was passed through the conductive terminals, each of the LED elements emitted a blue light having an emission peak wavelength of 450 nm, the phosphor of example 1, the green phosphor, the yellow phosphor and the red phosphor were excited by this blue light and emitted a blue-green light, a green light, a yellow light and a red light respectively, and these light emissions were mixed to generate white light.

Example 73

With the exceptions of changing the light-emitting element (LED) and the phosphors used, a bullet white light-emitting diode lamp (white light-emitting device) shown in FIG. 3 was produced in the same manner as example 69.

An ultraviolet LED element having an emission peak wavelength of 380 nm was used as the light-emitting element (LED), and a structure was produced in which the phosphor of example 1, the phosphor of example 44, a $BaMgAl_{10}O_{17}$:Eu phosphor, and a $CaAlSiN_3$:Eu phosphor as a red phosphor were dispersed within a resin layer composed of a silicone resin, and this resin layer was then disposed on top of the ultraviolet LED element.

An illumination device for a display device was produced in which the above white light-emitting devices were arrayed in a grid on a substrate.

Further, a display device that used this illumination device as a backlight was also produced. When a current was passed through the conductive terminals, each of the LED elements emitted an ultraviolet light having an emission peak wavelength of 380 nm, the phosphor of example 1, the phosphor of example 44, the $BaMgAl_{10}O_{17}$:Eu phosphor and the red phosphor were excited by this blue light and emitted a blue-green light, a green light, a yellow light and a red light respectively, and these light emissions were mixed to generate white light.

Example 74

With the exceptions of using a silicone resin with a refractive index of 1.51 as the first resin, using a silicone resin with a refractive index of 1.41 as the second resin, and changing the phosphors used, a bullet white light-emitting diode lamp (white light-emitting device) shown in FIG. 3 was produced in the same manner as example 69.

In this example, 15% by mass of the phosphor of example 1 as a blue-green phosphor, and 26% by mass of a $CaAlSiN_3$:Eu phosphor as a red phosphor were mixed into the silicone resin, and an appropriate amount of the resin was then applied dropwise using a dispenser to form the first resin having the phosphors dispersed therein.

An illumination device for a display device was produced in which the above white light-emitting devices were arrayed in a grid on a substrate.

Further, a display device that used this illumination device as a backlight was also produced. When a current was passed through the conductive terminals, each of the LED elements emitted a blue light having an emission peak wavelength of 450 nm, the phosphor of example 1 and the red phosphor were excited by this blue light and emitted a blue-green light and a red light respectively, and these light emissions were mixed to generate white light.

Example 75

With the exceptions of using a silicone resin with a refractive index of 1.51 as the first resin, using a silicone resin with a refractive index of 1.41 as the second resin, and changing the phosphors used, a bullet white light-emitting diode lamp (white light-emitting device) shown in FIG. 3 was produced in the same manner as example 69.

In this example, 15% by mass of the phosphor of example 1 as a blue-green phosphor, 12% by mass of a β-sialon phosphor as a green phosphor, and 26% by mass of a $CaAlSiN_3$:Eu phosphor as a red phosphor were mixed into the silicone resin, and an appropriate amount of the resin was then applied dropwise using a dispenser to form the first resin having the phosphors dispersed therein.

An illumination device for a display device was produced in which the above white light-emitting devices were arrayed in a grid on a substrate.

Further, a display device that used this illumination device as a backlight was also produced. When a current was passed through the conductive terminals, each of the LED elements emitted a blue light having an emission peak wavelength of 450 nm, the phosphor of example 1, the green phosphor and the red phosphor were excited by this blue light and emitted a blue-green light, a green light and a red light respectively, and these light emissions were mixed to generate white light.

Example 76

With the exceptions of using a silicone resin with a refractive index of 1.51 as the first resin, using a silicone resin with a refractive index of 1.41 as the second resin, and changing the phosphors used, a bullet white light-emitting diode lamp (white light-emitting device) shown in FIG. 3 was produced in the same manner as example 69.

In this example, 15% by mass of the phosphor of example 1 as a blue-green phosphor, 13% by mass of a $Ca_3Sc_2Si_3O_{12}$:Ce phosphor as a green phosphor, and 26% by mass of a $CaAlSiN_3$:Eu phosphor as a red phosphor were mixed into the silicone resin, and an appropriate amount of the resin was then applied dropwise using a dispenser to form the first resin having the phosphors dispersed therein.

An illumination device for a display device was produced in which the above white light-emitting devices were arrayed in a grid on a substrate.

Further, a display device that used this illumination device as a backlight was also produced. When a current was passed through the conductive terminals, each of the LED elements emitted a blue light having an emission peak wavelength of 450 nm, the phosphor of example 1, the green phosphor and the red phosphor were excited by this blue light and emitted a blue-green light, a green light and a red light respectively, and these light emissions were mixed to generate white light.

Example 77

With the exceptions of using a silicone resin with a refractive index of 1.51 as the first resin, using a silicone resin with a refractive index of 1.41 as the second resin, and changing the phosphors used, a bullet white light-emitting diode lamp (white light-emitting device) shown in FIG. 3 was produced in the same manner as example 69.

In this example, 15% by mass of the phosphor of example 1 as a blue-green phosphor, 13% by mass of a β-sialon phosphor as a green phosphor, 18% by mass of an α-sialon phosphor as a yellow phosphor, and 26% by mass of a $CaAlSiN_3$:Eu phosphor as a red phosphor were mixed into the silicone resin, and an appropriate amount of the resin was then applied dropwise using a dispenser to form the first resin having the phosphors dispersed therein.

An illumination device for a display device was produced in which the above white light-emitting devices were arrayed in a grid on a substrate.

Further, a display device that used this illumination device as a backlight was also produced. When a current was passed through the conductive terminals, each of the LED elements emitted a blue light having an emission peak wavelength of 450 nm, the phosphor of example 1, the green phosphor, the yellow phosphor and the red phosphor were excited by this blue light and emitted a blue-green light, a green light, a yellow light and a red light respectively, and these light emissions were mixed to generate white light.

Example 78

With the exceptions of using a silicone resin with a refractive index of 1.51 as the first resin, using a silicone resin with a refractive index of 1.41 as the second resin, and changing the phosphors used, a bullet white light-emitting diode lamp (white light-emitting device) shown in FIG. 3 was produced in the same manner as example 69.

In this example, 15% by mass of the phosphor of example 1 as a blue-green phosphor, 13% by mass of a β-sialon phosphor as a green phosphor, 18% by mass of a YAG:Ce phosphor as a yellow phosphor, and 26% by mass of a $CaAlSiN_3$:Eu phosphor as a red phosphor were mixed into the silicone resin, and an appropriate amount of the resin was then applied dropwise using a dispenser to form the first resin having the phosphors dispersed therein.

An illumination device for a display device was produced in which the above white light-emitting devices were arrayed in a grid on a substrate.

Further, a display device that used this illumination device as a backlight was also produced. When a current was passed through the conductive terminals, each of the LED elements emitted a blue light having an emission peak wavelength of 450 nm, the phosphor of example 1, the green phosphor, the yellow phosphor and the red phosphor were excited by this blue light and emitted a blue-green light, a green light, a yellow light and a red light respectively, and these light emissions were mixed to generate white light.

Example 79

A chip-type white light-emitting diode lamp for substrate mounting (a white light-emitting device) illustrated in FIG. 6 was produced.

First, a blue light-emitting diode was positioned in substantially the central portion of an alumina ceramic substrate to which the first lead wire and the second lead wire had been connected. The bottom electrode of the blue light-emitting diode was connected to the first lead wire, and the top electrode was connected to the second lead wire via a bonding wire. Further, a wall member having a hole was positioned on the light-emitting element side of the alumina ceramic substrate, and the wall member was fixed to the substrate so that the light-emitting element was housed inside the hole. Next, the first resin (encapsulating resin) was formed so as to cover the blue light-emitting diode, and a second resin (a separate encapsulating resin) that contained no phosphor was formed so as to cover the first resin and fill the hole.

With the exceptions of the procedures for securing the first lead wire, the second lead wire and the wall member to the alumina ceramic substrate, the production procedure was substantially the same as that described for example 69.

In this example, the wall member was formed using a white silicone resin, and the same epoxy resin was used for the first resin and the second resin In terms of phosphors, the phosphor of example 1 was used, together with the phosphor of example 44 as a green phosphor, and the $CaAlSiN_3$:Eu phosphor as a red phosphor. An illumination device for a display device was produced in which the above white light-emitting devices were arrayed in a grid on a substrate. Further, a display device that used this illumination device as a backlight was also produced. When a current was passed through the conductive terminals, a white light emission was confirmed.

Example 80

A chip-type white light-emitting diode lamp for substrate mounting (a white light-emitting device) illustrated in FIG. 8 was produced.

First, a blue light-emitting diode (blue LED chip) having a same-surface electrode structure and an emission peak wavelength of 450 nm was die-bonded, using a resin paste, to the lead frame of a surface-mounted LED package casing, which included a silver-plated copper lead frame, a molded substrate of a nylon resin and a reflector. As the blue light-emitting diode, a square LED chip having a length along one side of 350 μm was used, and a total of three of these light-emitting diodes were mounted.

Next, the two electrodes on the top of each blue light-emitting diode were connected using two separate bonding wires (fine gold wires), with the first bonding wire being connected to the lead frame, and the other bonding wire being connected to another lead frame.

Subsequently, an appropriate amount of a methyl silicone resin containing the phosphor was applied dropwise, so as to cover the light-emitting diode element and fill the hole within the wall member, and following curing of the resin, the light-emitting device packages were trimmed from the integrated member. The individual light-emitting device packages were sorted in terms of color tone and light emission intensity, thus yielding chip-type white light-emitting diode lamps for substrate mounting.

In this example, the phosphor of example 1 and a sialon phosphor were used as the phosphors. The light emission efficiency of the white light-emitting device was 100 lm/W, and the emission of a white light with a color temperature of approximately 5,500 K was confirmed.

An illumination device for a display device was produced in which the above white light-emitting devices were arrayed in a grid on a substrate.

Further, a display device that used this illumination device as a backlight was also produced. The color rendering index of the display device was an Ra value of approximately 90. The electric power supplied was 0.18 W per package, and the electric power density, reported as a surface area density per package, was $2 \times 10^4$ W/m$^2$.

Example 81

With the exceptions of using an ultraviolet LED chip as the light-emitting diode element, forming a printed wiring pattern of Cu on the ceramic molded substrate, using a surface-mounted LED package casing having a ceramic reflector bonded to the casing, and changing the phosphors used, a chip-type white light-emitting diode lamp for substrate mounting (a white light-emitting device) illustrated in FIG. 8 was produced in the same manner as example 80.

In this example, the phosphor of example 1, a sialon phosphor, and a CaAlSiN-based phosphor were used as phosphors. The light emission efficiency of the white light-emitting device was 120 lm/W, and the emission of a white light with a color temperature of approximately 5,600 K was confirmed.

An illumination device for a display device was produced in which the above white light-emitting devices were arrayed in a grid on a substrate.

Further, a display device that used this illumination device as a backlight was also produced. The color rendering index of the display device was an Ra value of approximately 98. The electric power supplied was 0.18 W per package, and the electric power density, reported as a surface area density per package, was $2 \times 10^4$ W/m$^2$.

Example 82

With the exceptions of using a blue light-emitting diode (blue LED chip) having an emission peak at 440 nm as the light-emitting diode element, and mounting a single large square chip having a length along one side of 1 mm, a chip-type white light-emitting diode lamp for substrate mounting (a white light-emitting device) illustrated in FIG. 8 was produced in the same manner as example 80.

In this example, the phosphor of example 1 and a sialon phosphor were used as phosphors. The light emission efficiency of the white light-emitting device was 90 lm/W, and the emission of a white light with a color temperature of approximately 5,000 K was confirmed.

An illumination device for a display device was produced in which the above white light-emitting devices were arrayed in a grid on a substrate.

Further, a display device that used this illumination device as a backlight was also produced. The color rendering index of the display device was an Ra value of approximately 87. The electric power supplied was 1 W per package, and the electric power density, reported as a surface area density per package, was $1 \times 10^3$ W/m$^2$.

Example 83

With the exceptions of using a blue light-emitting diode (blue LED chip) having an emission peak at 470 nm as the light-emitting diode element, forming the first resin with the phosphors dispersed therein so as to cover the light-emitting diode element with a dome-like portion of resin, and then forming the second resin with no phosphors dispersed therein, a chip-type white light-emitting diode lamp for substrate mounting (a white light-emitting device) illustrated in FIG. 7 was produced in the same manner as example 80.

A phenyl silicone resin containing no phosphors was used as the second resin.

In this example, the phosphor of example 1 and a sialon phosphor were used as phosphors. The light emission efficiency of the white light-emitting device was 110 lm/W, and the emission of a white light with a color temperature of approximately 5,200 K was confirmed.

An illumination device for a display device was produced in which the above white light-emitting devices were arrayed in a grid on a substrate.

Further, a display device that used this illumination device as a backlight was also produced. The color rendering index of the display device was an Ra value of approximately 93. The electric power supplied was 0.18 W per package, and the electric power density, reported as a surface area density per package, was $2 \times 10^4$ W/m$^2$.

Example 84

With the exceptions of not forming the first resin, using a sputtering method to deposit a 10 μm layer of the phosphor of the present invention on the p-side transparent electrode of the blue light-emitting diode (blue LED chip), and then forming the second resin with no phosphors dispersed therein, a chip-type white light-emitting diode lamp for substrate mounting (a white light-emitting device) illustrated in FIG. 9 was produced in the same manner as example 80.

In this example, the phosphor of example 1 and a sialon phosphor were used as phosphors. The light emission efficiency of the white light-emitting device was 140 lm/W, and the emission of a white light with a color temperature of approximately 4,500 K was confirmed.

An illumination device for a display device was produced in which the above white light-emitting devices were arrayed in a grid on a substrate.

Further, a display device that used this illumination device as a backlight was also produced. The color rendering index of the display device was an Ra value of approximately 85. The electric power supplied was 0.18 W per package, and the electric power density, reported as a surface area density per package, was $2 \times 10^4$ W/m$^2$.

Example 85

A so-called chip-on-board (COB) white light-emitting diode (light-emitting device) was produced by mounting a blue light-emitting diode (blue LED chip) directly on a glass-containing epoxy rein substrate having a printed wiring pattern thereon, and subsequently encapsulating the structure in a resin.

The blue light-emitting diode (blue LED chip) was mounted on an aluminum substrate, and a glass-containing epoxy rein substrate having a printed wiring pattern thereon was then overlaid and bonded to the aluminum substrate.

An open hole was provided in the substrate at the location where the blue light-emitting diode (blue LED chip) was mounted, meaning the blue light-emitting diode (blue LED chip) was visible at the surface of the structure. The blue light-emitting diode (blue LED chip) and the wiring were connected by gold wires. An appropriate amount of a methyl silicone resin containing the phosphor was then applied dropwise to the structure and cured.

In this example, the phosphor of example 1 and a sialon phosphor were used as phosphors. The light emission efficiency of the white light-emitting device was 100 lm/W, and the emission of a warm white light with a color temperature of approximately 5,500 K was confirmed. An illumination device for a display device was produced in which the above white light-emitting devices were arrayed in a grid on a substrate. Further, a display device that used this illumination device as a backlight was also produced. The color rendering index of the display device was an Ra value of approximately 90.

Example 86

With the exceptions of using an ultraviolet light-emitting diode (ultraviolet LED chip) having an emission peak at 390 nm as the light-emitting diode element, forming a printed wiring pattern of Cu on the ceramic molded substrate, using a surface-mounted LED package casing having a ceramic reflector bonded to the casing, and changing the phosphors used, a chip-type white light-emitting diode lamp for substrate mounting (a white light-emitting device) illustrated in FIG. 8 was produced in the same manner as example 80.

In this example, only the phosphor of example 49 was used as the phosphor. The light emission output of the white light-emitting device was 18 mW. The current was changed from 100 μA to 50 mA, but almost no change in the light emission wavelength was observed with the change in current. An illumination device for a display device was produced in which the above white light-emitting devices were arrayed in a grid on a substrate. Further, a display device that used this illumination device as a backlight was also produced.

Example 87

With the exceptions of using an ultraviolet light-emitting diode (ultraviolet LED chip) having an emission peak at 390 nm as the light-emitting diode element, forming a printed wiring pattern of Cu on the ceramic molded substrate, using a surface-mounted LED package casing having a ceramic reflector bonded to the casing, and changing the phosphors used, a chip-type white light-emitting diode lamp for substrate mounting (a white light-emitting device) illustrated in FIG. 8 was produced in the same manner as example 80.

In this example, only the phosphor of example 57 was used as the phosphor. The light emission output of the white light-emitting device was 40 mW. The current was changed from 100 μA to 50 mA, but almost no change in the light emission wavelength was observed with the change in current. An illumination device for a display device was produced in which the above white light-emitting devices were arrayed in a grid on a substrate. Further, a display device that used this illumination device as a backlight was also produced.

Example 88

With the exceptions of using an ultraviolet light-emitting diode (ultraviolet LED chip) having an emission peak at 390 nm as the light-emitting diode element, forming a printed wiring pattern of Cu on the ceramic molded substrate, using a surface-mounted LED package casing having a ceramic reflector bonded to the casing, and changing the phosphors used, a chip-type white light-emitting diode lamp for substrate mounting (a white light-emitting device) illustrated in FIG. 8 was produced in the same manner as example 80.

In this example, only the phosphor of example 1 was used as the phosphor. The light emission output of the white light-emitting device was 35 mW. The current was changed from 100 μA to 50 mA, but almost no change in the light emission wavelength was observed with the change in current. An illumination device for a display device was produced in which the above white light-emitting devices were arrayed in a grid on a substrate. Further, a display device that used this illumination device as a backlight was also produced.

Example 89

With the exception of changing the phosphors used, a chip-type white light-emitting diode lamp for substrate mounting (a white light-emitting device) illustrated in FIG. 8 was produced in the same manner as example 80.

In this example, the phosphor of example 1, a sialon phosphor, and a CaAlSiN phosphor were used as phosphors. The light emission efficiency of the white light-emitting device was 120 lm/W, and the emission of a white light with a color temperature of approximately 5,300 K was confirmed.

An illumination device for a display device was produced in which the above white light-emitting devices were arrayed in a grid on a substrate.

Further, a display device that used this illumination device as a backlight was also produced. The color rendering index of the display device was an Ra value of approximately 96. The electric power supplied was 0.18 W per package, and the electric power density, reported as a surface area density per package, was $2 \times 10^4$ W/m$^2$.

Example 90

With the exception of changing the phosphors used, a chip-type white light-emitting diode lamp for substrate mounting (a white light-emitting device) illustrated in FIG. 8 was produced in the same manner as example 80.

In this example, a mixture of the phosphors from example 29 through to example 68, and a CaAlSiN phosphor were used as phosphors. The light emission efficiency of the white light-emitting device was 100 lm/W, and the emission of a white light with a color temperature of approximately 5,500 K was confirmed. An illumination device for a display device was produced in which the above white light-emitting devices were arrayed in a grid on a substrate. Further, a display device that used this illumination device as a backlight was also produced. The color rendering index of the display device was an Ra value of approximately 99. The electric power supplied was 0.18 W per package, and the electric power density, reported as a surface area density per package, was $2 \times 10^4$ W/m².

INDUSTRIAL APPLICABILITY

The illumination device for a display device and the display device according to the present invention can be used in industrial applications that involve the production and use of display device illumination devices and display devices that exhibit high brightness, long life, and excellent color reproducibility.

DESCRIPTION OF THE REFERENCE SYMBOLS

1 Bullet white LED device (bullet-type light-emitting diode lamp)
2 Lead wire
2a Recessed section
3 Lead wire
3b Tip
4 Light-emitting diode element (LED chip)
4a, 4b Electrode
5 Bonding wire
6 Resin
7 Phosphor
8 Resin
11 Surface-mounted white LED device (chip-type white light-emitting diode lamp for substrate mounting)
12 Lead wire
13 Lead wire
15 Bonding wire
16 Resin
17 Phosphor
18 Resin
19 Substrate
20 Wall member
20a Hole
20b Reflector surface
23 Phosphor
24 Light-emitting diode element (LED chip)
24a, 24b Electrode
40 Light source
115, 116, 117 Surface-mounted white LED device (chip-type white light-emitting diode lamp for substrate mounting)
211 Liquid crystal display panel
211a Display surface
212 Color filter
214 Substrate
214a Front surface
200 White light-emitting device
201, 202 Display device
221, 222 Illumination device for display device

The invention claimed is:

1. An illumination device for a display device, which comprises a substrate and a plurality of white light-emitting devices disposed on top of the substrate, and can be used as a backlight for a liquid crystal display panel, wherein
the white light-emitting devices have a light source and a phosphor that is excited by the light source and emits light, and
a fluorescent material with a composition represented by a general formula: $M(0)_a M(1)_b M(2)_{x-(vm+n)} M(3)_{(vm+n)-y} O_n N_{z-n}$ is used as the phosphor, wherein
M(0) represents one or more elements selected from the group consisting of Li, Na, Be, Mg, Ca, Sr, Ba, Sc, Y, La, Gd and Lu, M(1) represents one or more activators selected from the group consisting of Mn, Ce, Pr, Nd, Sm, Eu, Tb, Dy, Ho, Er, Tm and Yb, M(2) represents one or more elements selected from the group consisting of Si, Ge, Sn, Ti, Hf and Zr, M(3) represents one or more elements selected from the group consisting of Be, B, Al, Ga, In, Tl and Zn, O represents elemental oxygen, N represents elemental nitrogen,
x, y and z are numbers that satisfy $33 \leq x \leq 51$, $8 \leq y \leq 12$ and $36 \leq z \leq 56$ respectively, a and b are numbers that satisfy $3 \leq a+b \leq 7$ and $0.001 \leq b \leq 1.2$, m and n are numbers which, when me=a+b, satisfy $0.8 \cdot me \leq m \leq 1.2 \cdot me$ and $0 \leq n \leq 7$, and v is a number which, when v(0) represents a valency of an M(0) ion and v(1) represents a valency of an M(1) ion, satisfies $v=\{a \cdot v(0)+b \cdot v(1)\}/(a+b)$.

2. The illumination device for a display device according to claim 1, wherein M(1) in the fluorescent material is Eu, and b is a number that satisfies $0.005<b<0.3$.

3. The illumination device for a display device according to claim 1, wherein M(1) in the fluorescent material is Eu, and b is a number that satisfies $0.01<b<0.2$.

4. The illumination device for a display device according to claim 1, wherein x, y and z in the fluorescent material are x=42, y=10 and z=46 respectively.

5. The illumination device for a display device according to claim 1, wherein M(0) in the fluorescent material is one or more elements selected from the group consisting of Ca, Sr and Ba.

6. The illumination device for a display device according to claim 1, wherein M(2) in the fluorescent material is Si, and M(3) is Al.

7. The illumination device for a display device according to claim 1, wherein n in the fluorescent material is a number that satisfies n<me.

8. The illumination device for a display device according to claim 1, wherein, as the phosphor, a phosphor is used in which an amount of the fluorescent material is not less than 80% by volume, and a remainder is composed of one or more substances selected from the group consisting of β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_n N_{(32-n)}$ (n~1) and $SrSi_6N_8$.

9. The illumination device for a display device according to claim 1, wherein a transparent film is formed at least partially on a surface of the phosphor, and if a refractive index of the transparent film is termed $n_k$, then a thickness of the transparent film is within a range from $(10 \text{ to } 180)/n_k$ nm.

10. The illumination device for a display device according to claim 1, wherein, as the phosphor, a red light-emitting fluorescent material is used in addition to the fluorescent material.

11. The illumination device for a display device according to claim 10, wherein the red light-emitting fluorescent material is $CaAlSiN_3$:Eu.

12. The illumination device for a display device according to claim 1, wherein the light source is a blue light-emitting LED chip having an emission peak wavelength within a range from 330 to 500 nm.

13. The illumination device for a display device according to claim 1, wherein a white light emission is obtained from each of the white light-emitting devices by mixing a blue light emission from the LED chip, a green light emission from the fluorescent material that has been excited by the blue light emission, and a red light emission from the red light-emitting fluorescent material that has been excited by the blue light emission.

14. The illumination device for a display device according to claim 1, wherein each of the white light-emitting devices is a bullet white LED device or a surface-mounted white LED device.

15. The illumination device for a display device according to claim 1, wherein each of the white light-emitting devices has an LED chip and a resin that is formed surrounding the LED chip, and the phosphor is dispersed within the resin.

16. The illumination device for a display device according to claim 1, wherein the phosphor is adhered directly to the LED chip so as to cover at least one surface of the LED chip.

17. The illumination device for a display device according to claim 1, wherein one side of the LED chip is larger than 350 μm.

18. The illumination device for a display device according to claim 1, wherein a plurality of the LED chips are provided.

19. A display device, comprising the illumination device for a display device according to claim 1, and a transmission-type liquid crystal display panel.

\* \* \* \* \*